(12) United States Patent
Morihara

(10) Patent No.: US 6,541,807 B1
(45) Date of Patent: Apr. 1, 2003

(54) SEMICONDUCTOR DEVICE HAVING CAPACITOR AND METHOD OF MANUFACTURING THE SAME

(75) Inventor: Toshinori Morihara, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/706,697

(22) Filed: Nov. 7, 2000

(30) Foreign Application Priority Data

Nov. 10, 1999 (JP) .............................. 11-319438
Jul. 6, 2000 (JP) ........................ 2000-204800

(51) Int. Cl.[7] .................. H01L 21/20; H01L 27/108
(52) U.S. Cl. ............... 257/295; 257/303; 257/295; 257/306; 257/396; 257/398
(58) Field of Search ................. 257/295, 306, 257/396, 398, 303

(56) References Cited

U.S. PATENT DOCUMENTS

| | | | |
|---|---|---|---|
| 5,960,294 A | * | 9/1999 | Zahurak et al. |
| 6,207,523 B1 | * | 3/2001 | Parekh et al. |
| 6,259,127 B1 | * | 7/2001 | Pan |
| 6,417,066 B1 | * | 7/2002 | Lou |
| 6,468,854 B1 | * | 10/2002 | Agarwal |
| 6,483,194 B2 | * | 11/2002 | Sakao |

FOREIGN PATENT DOCUMENTS

| | | |
|---|---|---|
| EP | 0669646 A1 * | 8/1995 |
| GB | 2 328 216 A | 2/1999 |
| JP | 5-110023 | 4/1993 |
| JP | 6-69417 | 3/1994 |
| JP | 10-275901 | 10/1998 |
| JP | 11-54473 | 2/1999 |
| JP | 11-145389 | 5/1999 |
| KR | 1999-0079780 | 5/1999 |

OTHER PUBLICATIONS

"Cylindrical Full Metal Capacitor Technology for High–Speed Gigabit DRAMs", J.M. Drynan et al., 1997 Symposium on VLSI Technology Digest of Technical Papers, pp. 151–152.

* cited by examiner

*Primary Examiner*—Stephen D. Meier
(74) *Attorney, Agent, or Firm*—McDermott, Will & Emery

(57) ABSTRACT

A storage node electrically connected to one of source/drain regions of a MOS transistor is formed along the side wall and the bottom wall of an opening provided through a silicon nitride film, a BPTEOS film and a TEOS film. The surface of this storage node is roughened. Thus, a semiconductor device having high reliability and a method of manufacturing the same are obtained.

4 Claims, 33 Drawing Sheets

HF+H2O+PO3 SOLUTION

US 6,541,807 B1

SEMICONDUCTOR DEVICE HAVING CAPACITOR AND METHOD OF MANUFACTURING THE SAME

BACKGROUND OF THE INVENTION

1. Field of the Invention

The present invention relates to a semiconductor device having a capacitor and a method of manufacturing the same, and more specifically, it relates to a semiconductor device having a capacitor of a roughened surface shape and a method of manufacturing the same.

2. Description of the Prior Art

In recent years, the demand for semiconductor devices is rapidly expanded due to remarkable popularization of information devices such as computers. In function, a semiconductor device having a large storage capacity and capable of performing high-speed operations is required. Following this, technical development is progressed in relation to improvement in degree of integration and high-speed response or high reliability of the semiconductor device.

A DRAM (dynamic random access memory) is generally known as a semiconductor device capable of inputting/outputting stored information at random. This DRAM is formed by a memory cell array serving as a storage area storing a number of information and a peripheral circuit controlling memory cells included in the memory cell array for inputting/outputting the information from/to an external device.

The memory cell array occupies a large area on the semiconductor chip of such a DRAM. A plurality of memory cells for storing unit information are arranged on the memory cell array in the form of a matrix. Each memory cell is generally formed by a single MOS (metal oxide semiconductor) transistor and a single capacitor connected thereto, and widely known as a one transistor-one capacitor memory cell.

FIG. 23 is a schematic sectional view showing the structure of memory cells of a DRAM employed as a conventional semiconductor device having capacitors. Referring to FIG. 23, a plurality of MOS transistors 120 are formed on a surface of a silicon substrate 111 electrically isolated by a trench isolation 123.

Each MOS transistor 120 includes a pair of source/drain regions 112 having an LDD (lightly doped drain) structure, a gate oxide film 113 and a gate electrode layer 114. The gate electrode layer 114 has a polycrystalline silicon layer (hereinafter referred to as a doped polysilicon layer) 114a doped with an impurity and a tungsten silicide ($WSi_2$) layer 114b.

A silicon nitride film 115 is formed on the gate electrode layer 114, and a silicon oxide film 116 is formed to cover the periphery thereof. A pad layer 117a and a bit line 117b are connected to the first and second ones of the pair of source/drain regions 112 respectively. An interlayer isolation layer 118 is formed on the overall surface of the silicon substrate 111 to cover the pad layer 117a, the bit line 117b and the MOS transistor 120. A plug layer 119 is embedded in a hole 118a of the interlayer isolation layer 118 to come into contact with the pad layer 117a. A silicon nitride film 124 and a BPTEOS (borophosphotetraethyl orthosilicate) film 104 are formed on the interlayer isolation layer 118. An opening 106 for each storage node 101 is formed in the silicon nitride film 124 and the BPTEOS film 104.

Each capacitor 110 has the storage node 101, a capacitor dielectric layer 102 and a cell plate 103. The storage node 101 is formed along the side wall and the bottom wall of the opening 106, and electrically connected to the source/drain regions 112 through the plug layer 119 and the pad layer 117a. The cell plate 103 is formed to be opposed to the storage node 101 through the capacitor dielectric layer 102.

A method of manufacturing the conventional semiconductor device having capacitors is now described.

FIGS. 24 to 28 are schematic sectional views showing the method of manufacturing the conventional semiconductor device having capacitors in the step order. Referring to FIG. 24, the MOS transistor 120, the pad layer 117a, the bit line 117b and the like are formed on the surface of the silicon substrate 111 formed with the trench isolation 123. Thereafter the interlayer isolation layer 118 is formed to cover the surfaces thereof, and the plug layer 119 is formed to be electrically connected with the pad layer 117a. The silicon nitride film 124 and the BPTEOS film 104 are formed on the overall surface of the interlayer isolation layer 118.

Referring to FIG. 25, the opening 106 for the storage node 101 is formed in the silicon nitride film 124 and the BPTEOS film 104 by general photolithography and etching.

Referring to FIG. 26, an amorphous silicon layer (hereinafter referred to as a doped amorphous silicon layer) 101 doped with an impurity is formed on the overall surface and thereafter subjected to surface roughening. Thus, the doped polysilicon layer 101 is formed with a roughened surface.

Referring to FIG. 27, photoresist 131 is embedded in the opening 106. Anisotropic etching (etchback) is performed on the overall surface through the photoresist 131 defining a mask, until at least the upper surface of the BPTEOS 104 is exposed. Thereafter the photoresist 131 is removed.

Referring to FIG. 28, the doped polysilicon layer 101 is left along the side wall and the bottom wall of the opening 106 through the aforementioned etchback, to form the storage node 101. Thereafter a natural oxide film is removed through buffer hydrofluoric acid (BHF) employing a mixed solution of hydrofluoric acid and ammonium fluoride.

Then, the capacitor dielectric layer 102 and the cell plate 103 are formed for manufacturing the semiconductor device having the capacitors 110 shown in FIG. 23.

However, the conventional semiconductor device having capacitors is inferior in reliability. This problem is now described in detail.

(1) In the storage node 101 subjected to surface roughening as described above, crystal grains 101b of silicon grow on an underlayer 101a consisting of doped polysilicon, as shown in FIG. 29. In this state, etching is performed with BHF in the conventional method for removing the natural oxide film. However, this BHF contains the mixed solution of hydrofluoric acid and ammonium fluoride, and this ammonium fluoride etches silicon.

Therefore, it is apprehended that the crystal grains 101b readily separate from the underlayer 101a in FIG. 29 and the separating crystal grains 101b adhere to the upper surface of the BPTEOS film 104 as shown in FIG. 30. In this case, the storage node 101 may be shorted to the adjacent storage node 101 by the re-adhering crystal grains 101b, to reduce the reliability of the semiconductor device.

(2) In general, the etchback step shown in FIGS. 27 and 28 is carried out through anisotropic etching. In this anisotropic etching, a residue is left along the side wall of the pattern due to the anisotropy of the etching. After the etchback step, therefore, the upper end of the storage node 101 defines a sharp forward end 101c along the side wall, as shown in FIG. 31.

When etching is thereafter performed with BHF for removing the natural oxide film, the upper surface of the BPTEOS film 104 is removed and the forward end 101c projects beyond the upper end of the BPTEOS film 104, as shown in FIGS. 32 and 33. The projecting forward end 101c is readily broken and separated due to vibration in a later washing step or the like. The separated forward end 101c may adhere to the upper surface of the BPTEOS film 104. In this case, the storage node 101 is shorted to the adjacent storage node 101 to reduce the reliability of the semiconductor device, similarly to the aforementioned case (1).

(3) Aqueous hydrofluoric acid (HF+$H_2O$) may be employed in place of BHF, in order to remove the natural oxide film. In this case, however, P (phosphorus) contained in the storage node 101 for providing conductivity is eluted from the surface of the storage node 101 into the aqueous hydrofluoric acid as phosphoric acid ($PO_3$), as shown in FIG. 34. Thus, the storage node 101 is reduced in conductivity, to reduce the capacitance as well as the reliability of the semiconductor device.

(4) When the spaces between the crystal grains 101b on the surface of the storage node 101 are narrow as shown in FIG. 35, the cell plate 103 cannot sufficiently fill up the clearances between the crystal grains 101b. Therefore, the opposed areas of the storage node 101 and the cell plate 103 are reduced to reduce the capacitance as well as the reliability of the semiconductor device.

SUMMARY OF THE INVENTION

An object of the present invention is to provide a semiconductor device having high reliability and a method of manufacturing the same.

A semiconductor device having a capacitor according to an aspect of the present invention includes a semiconductor substrate, a silicon nitride film, a first silicon oxide film, a second silicon oxide film and a lower electrode of a capacitor. The semiconductor substrate has a conductive region at the main surface. The silicon nitride film is formed on the main surface of the semiconductor substrate. The first silicon oxide film is formed on the silicon nitride film, and contains an impurity. The second silicon oxide film is formed on the first silicon oxide film, to substantially contain no impurities. An opening is formed through the silicon nitride film and the first and second silicon oxide films. The lower electrode of the capacitor is electrically connected with the conductive region and formed along the side wall and the bottom wall of the opening.

In the semiconductor device having a capacitor according to this aspect of the present invention, the second silicon oxide film formed on the first silicon oxide film substantially contains no impurities such as phosphorus and boron, dissimilarly to the first silicon oxide film. Therefore, the second silicon oxide is more hardly etched by aqueous hydrofluoric acid than the first silicon oxide film, and serves as an etching stopper. Thus, aqueous hydrofluoric acid can be employed for removing a natural oxide film from the surface of the lower electrode. In such etching with hydrofluoric acid, silicon is harder to etch as compared with etching with buffer hydrofluoric acid containing ammonium fluoride. Therefore, silicon crystal grains of the lower electrode can be prevented from separating from an underlayer of silicon and the lower electrode can be prevented from being shorted to another lower electrode, whereby the semiconductor device is improved in reliability.

Preferably in the aforementioned aspect, the upper end of the lower electrode is located downward beyond the upper surface of the second silicon oxide film.

Thus, the lower electrode is prevented from being shorted to another lower electrode resulting from breakage of the upper end of the lower electrode projecting beyond the upper surface of the second silicon oxide film, and the semiconductor device is improved in reliability.

Preferably in the aforementioned aspect, the lower electrode consists of a material containing silicon. An impurity supplying conductivity is introduced into the lower electrode in impurity concentration of the solubility limit of silicon.

Thus, the lower electrode has high conductivity, whereby a large capacitance can be ensured and the semiconductor device is further improved in reliability.

Preferably in the aforementioned aspect, the first silicon oxide film is prepared from an organic raw material to contain phosphorus and boron, and the second silicon oxide film is prepared from an organic raw material to substantially contain no impurities.

Thus, the second silicon oxide film can be more hardly etched by aqueous hydrofluoric acid than the first silicon oxide film.

A semiconductor device having a capacitor according to another aspect of the present invention includes a semiconductor substrate, an insulating layer, a lower electrode of a capacitor and a capacitor dielectric layer. The semiconductor substrate has a conductive region at the main surface. The insulating layer is formed on the main surface of the semiconductor substrate, and has an opening. The lower electrode of the capacitor is electrically connected with the conductive region, and has a surface formed of a plurality of crystal grains arranged along the side wall and the bottom wall of the opening at a space from each other on the surface thereof. The capacitor dielectric layer covers the lower electrode, and has a thickness less than half the space between the crystal grains of the surface of the lower electrode.

In the semiconductor device having a capacitor according to this aspect of the present invention, the capacitor dielectric layer, having the thickness less than half the space between the crystal grains on the surface of the lower electrode, is not completely embedded in clearances between the crystal grains. Therefore, an upper electrode can fill up the clearances between the crystal grains of the lower electrode to increase opposed areas of the lower electrode and the upper electrode, whereby a large capacitance can be ensured and the semiconductor device is improved in reliability.

Preferably in the aforementioned aspect, the semiconductor device further includes an upper electrode of the capacitor formed between the lower electrode and the side wall of the opening to be opposed to the lower electrode with the capacitor dielectric layer therebetween.

Thus, the lower electrode can be opposed to the upper electrode on both of the surface closer to the insulating layer and the opposite surface, whereby the capacitance can be increased and the semiconductor device is further improved in reliability.

Preferably in the aforementioned aspect, the insulating layer has a lower silicon oxide film and an upper silicon nitride film. The upper electrode is formed between the lower electrode and the side wall of the lower silicon oxide film, and the lower electrode is in contact with the side wall of the upper silicon nitride film.

The silicon nitride film is in close contact with the upper end of the lower electrode, whereby a portion of the lower electrode along the side wall of the opening can be prevented from falling in a manufacturing step.

A method of manufacturing a semiconductor device having a capacitor according to still another aspect of the present invention includes the following steps:

First, a conductive region is formed at the main surface of a semiconductor substrate. A silicon nitride film is formed on the main surface of the semiconductor substrate. A first silicon oxide film containing an impurity is formed on the first silicon oxide film. A second silicon oxide film substantially containing no impurities is formed on the first silicon oxide film. An opening is formed through the silicon nitride film and the first and second silicon oxide films. A lower electrode of a capacitor electrically connected with the conductive region is formed along the side wall and the bottom wall of the opening. Etching is performed with aqueous hydrofluoric acid. After this etching, a capacitor dielectric layer is formed to cover the lower electrode.

In the method of manufacturing a semiconductor device having a capacitor according to this aspect of the present invention, the second silicon oxide film formed on the first silicon oxide film substantially contains no impurities such as phosphorus and boron, dissimilarly to the first silicon oxide film. Therefore, the second silicon oxide is more hardly etched by aqueous hydrofluoric acid than the first silicon oxide film, and serves as an etching stopper. Thus, aqueous hydrofluoric acid can be employed for removing a natural oxide film from the surface of the lower electrode. In such etching with hydrofluoric acid, silicon is harder to etch as compared with etching with buffer hydrofluoric acid containing ammonium fluoride. Therefore, silicon crystal grains of the lower electrode can be prevented from separating from an underlayer of silicon and the lower electrode can be prevented from being shorted to another lower electrode, whereby the semiconductor device is improved in reliability.

Preferably in the aforementioned aspect, the lower electrode is subjected to surface roughening so that a plurality of crystal grains on the surface thereof are located at a space from each other. The grain size of the crystal grains on the surface of the lower electrode after formation of the capacitor dielectric layer is not more than the grain size of the crystal grains on the surface of the lower electrode immediately after the surface roughening, and larger than such a grain size that the crystal grains on the surface of the lower electrode separate from the lower electrode.

Thus, the crystal grains can be prevented from separating from the surface of the lower electrode, and the lower electrode can be prevented from being shorted to another lower electrode. In this specification, "such a grain size that the crystal grains on the surface of the lower electrode separate from the lower electrode" is less than 1/1000 of the grain size of the crystal grains on the surface of the lower electrode immediately after the surface roughening.

A method of manufacturing a semiconductor device having a capacitor according to a further aspect of the present invention includes the following steps:

First, a conductive region is formed at the main surface of a semiconductor substrate. Then, an insulating layer having an opening is formed on the main surface of the semiconductor substrate. A conductive layer is formed on the insulating layer to be electrically connected with the conductive region and to be along the side wall and the bottom wall of the opening. A mask layer is formed only in the opening. A lower electrode of a capacitor is formed from the conductive layer so that the upper end of a portion of the conductive layer along the side wall of the opening is located downward beyond the upper surface of the insulating layer by performing isotropic etching for removing a portion of the conductive layer exposed from the mask layer.

In the method of manufacturing a semiconductor device having a capacitor according to this aspect of the present invention, the lower electrode of the capacitor is so formed that the upper end thereof is located downward beyond the upper surface of the insulating layer. Thus, the lower electrode can be prevented from being shorted to another lower electrode by breakage of the upper end of the lower electrode projecting beyond the upper surface of the insulating layer, and the semiconductor device is improved in reliability.

A method of manufacturing a semiconductor device having a capacitor according to a further aspect of the present invention includes the following steps:

First, a conductive region is formed at the main surface of a semiconductor substrate. An insulating layer having an opening is formed on the main surface of the semiconductor substrate. A lower electrode of a capacitor electrically connected with the conductive region is formed along the side wall and the bottom wall of the opening. Etching is performed on the lower electrode with aqueous hydrofluoric acid containing phosphorus.

In the method of manufacturing a semiconductor device having a capacitor according to this aspect of the present invention, the aqueous hydrofluoric acid saturated with addition of phosphorus is so employed as to prevent reaction between water contained in the aqueous hydrofluoric acid and phosphorus contained in the lower electrode. Therefore, phosphorus is prevented from elution from the lower electrode and the conductivity of the capacitor can be kept excellent, whereby a large capacitance can be ensured and the semiconductor device is improved in reliability.

A method of manufacturing a semiconductor device having a capacitor according to a further aspect of the present invention includes the following steps:

First, a conductive region is formed at the main surface of a semiconductor substrate. An insulating layer having an opening is formed on the main surface of the semiconductor substrate. A lower electrode of a capacitor electrically connected with the conductive region, along the side wall and the bottom wall of the opening and having a surface formed of a plurality of crystal grains thereof is formed. Etching is performed for controlling the space between the plurality of crystal grain sizes of the surface of the lower electrode. A capacitor dielectric layer covering the lower electrode and having a thickness less than half the space between the crystal grains of the surface of the lower electrode is formed.

In the method of manufacturing a semiconductor device having a capacitor according to this aspect of the present invention, the capacitor dielectric layer, having the thickness less than half the space between the crystal grains on the surface of the lower electrode, is not completely embedded in clearances between the crystal grains. Therefore, an upper electrode can fill up the clearances between the crystal grains of the lower electrode to increase opposed areas of the lower electrode and the upper electrode, whereby a large capacitance can be ensured and the semiconductor device is improved in reliability.

Preferably in the aforementioned aspect, the lower electrode is formed to have a plurality of holes. A clearance is formed between the lower electrode and the side wall of the insulating layer by etching the side wall of the insulating layer through the plurality of holes. An upper electrode of the capacitor is formed to be opposed to the lower electrode with the capacitor dielectric layer in the clearance therebetween.

Thus, the lower electrode can be opposed to the upper electrode on both of the surface closer to the insulating layer and the opposite surface, whereby the capacitance can be increased and the semiconductor device is further improved in reliability.

Preferably in the aforementioned aspect, the step of forming the insulating layer includes steps of forming a silicon oxide film and forming a silicon nitride film on the silicon oxide film. The clearance is formed between the lower electrode and the side wall of the silicon oxide film.

This silicon nitride film is in close contact with the upper end of the lower electrode, whereby a portion of the lower electrode along the side wall of the opening can be prevented from falling during the manufacturing steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
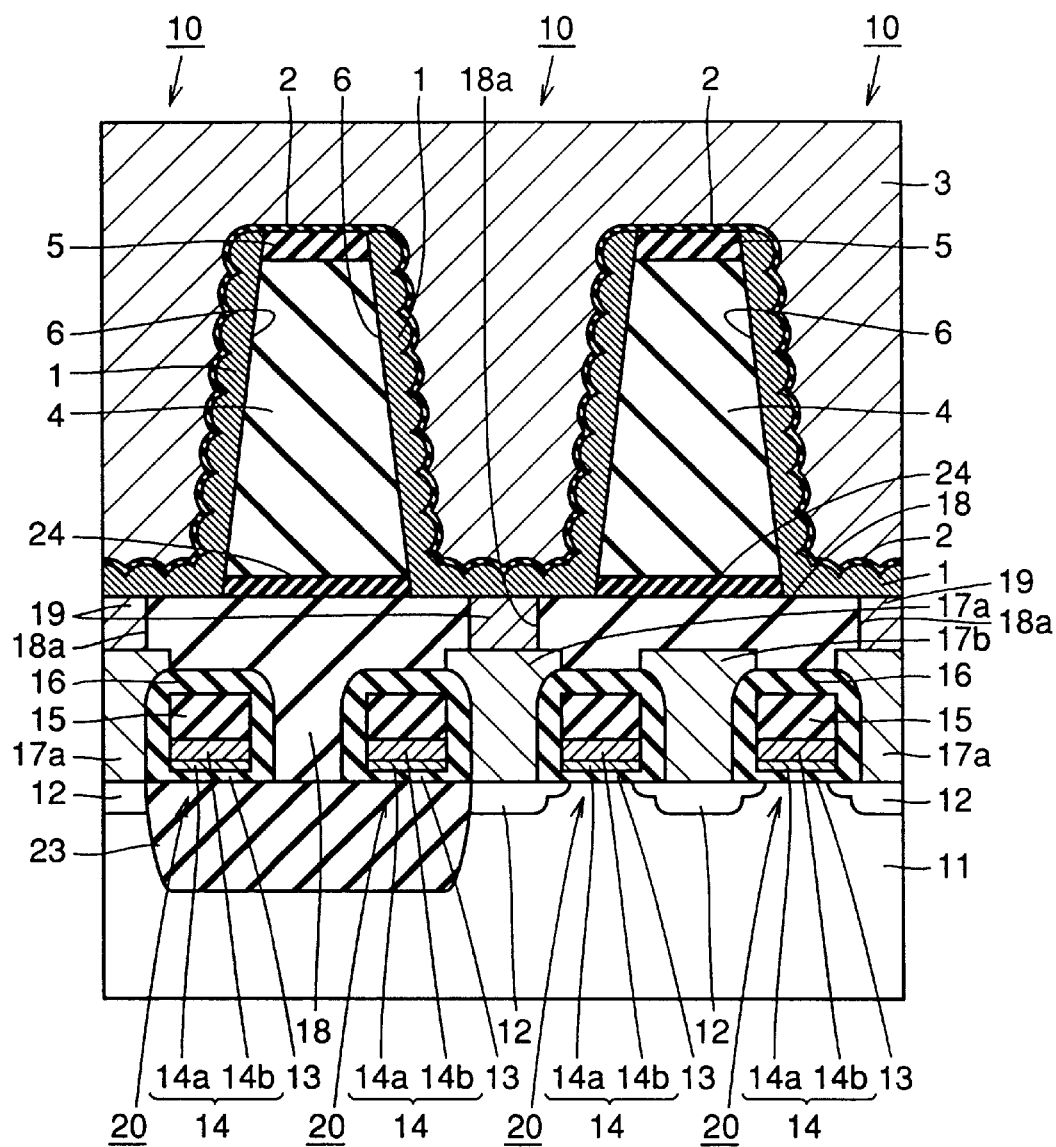
FIG. 1 is a sectional view schematically showing the structure of a semiconductor device having capacitors according to a first embodiment of the present invention.

Referring to FIG. 1, MOS transistors 20 are formed on a surface of a silicon substrate 11 electrically isolated by a trench isolation 23. The trench isolation 23 is formed by filling up a trench formed in the surface of the silicon substrate 11 with an insulating layer or the like.

Each MOS transistor 20 has a pair of source/drain regions 12, a gate insulating layer 13 and a gate electrode layer 14. The pair of source/drain regions 12, having an LDD structure, are arranged at a prescribed distance from each other. The gate electrode layer 14 is formed on a region held between the pair of source/drain regions 12 through the gate insulating layer 13. The gate insulating layer 13 consists of a silicon oxide film, for example. The gate electrode layer 14 has a two-layer structure of a doped polysilicon layer 14a and a tungsten silicide layer 14b, for example.

A silicon nitride film 15 is formed on the gate electrode layer 14, and the periphery thereof is covered with an insulating layer 16 consisting of a silicon oxide film, for example. A pad layer 17a is connected to one of the pair of source/drain regions 12, and a bit line 17b is connected to the remaining source/drain region 12. An interlayer isolation layer 18 is formed on the overall surface to cover the pad layer 17a, the bit line 17b and the MOS transistor 20. A plug layer 19 is embedded in a hole 18a provided in the interlayer isolation layer 18 to come into contact with the pad layer 17a. Each capacitor 10 is formed to be electrically connected with the plug layer 19.

A silicon nitride ($Si_3N_4$) film 24, a silicon oxide film (hereinafter referred to as a BPTEOS film) 4 prepared from an organic raw material of TEOS (tetraethyl orthosilicate) to contain B (boron) and P (phosphorus) and a silicon oxide film (hereinafter referred to as a TEOS film) 5 prepared from a raw material of TEOS to substantially contain no impurities are stacked on the interlayer isolation layer 18. The silicon nitride film 24 is formed in a thickness of 30 to 50 nm, for example, the BPTEOS film 4 is formed in a thickness of 1 to 2 $\mu$m, for example, and the TEOS film 5 is formed in a thickness of 100 to 400 nm, for example. An opening 6 reaching the upper surface of the interlayer isolation layer 18 is formed through the silicon nitride film 24, the BPTEOS film 4 and the TEOS film 5.

Figure 2:
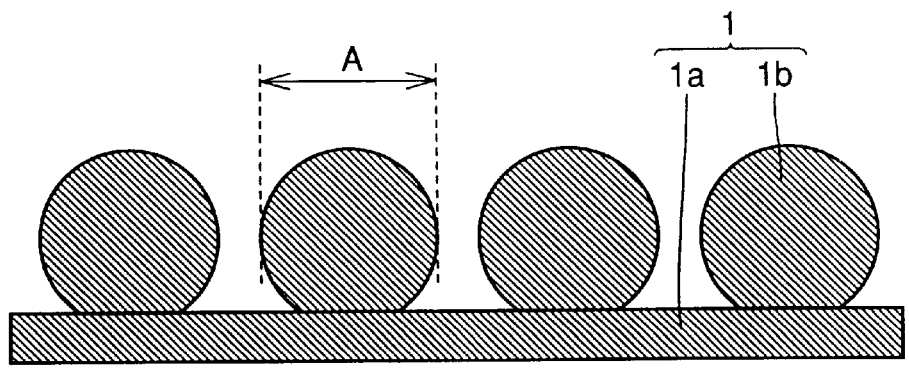
FIG. 2 illustrates a storage node shown in FIG. 1 in an enlarged manner.

The capacitor 10 has a storage node 1, a capacitor dielectric layer 2 and a cell plate 3, and the storage node 1 has a trimmed cylindrical capacitor structure with a roughened surface. The storage node 1 is formed along the side wall and the bottom wall of the opening 6, and has a roughened surface. As shown in FIG. 2, the roughened surface of the storage node 1 has such a structure that crystal grains 1b of silicon grow on dielectric layer 2 is formed to cover the storage node 1, and has a multilayer structure of a silicon oxide film and a silicon nitride film, for example. The cell plate 3 is formed to be opposed to the storage node 1 through the capacitor dielectric layer 2, and consists of doped polysilicon, for example.

A manufacturing method according to this embodiment is now described.

Figure 3:
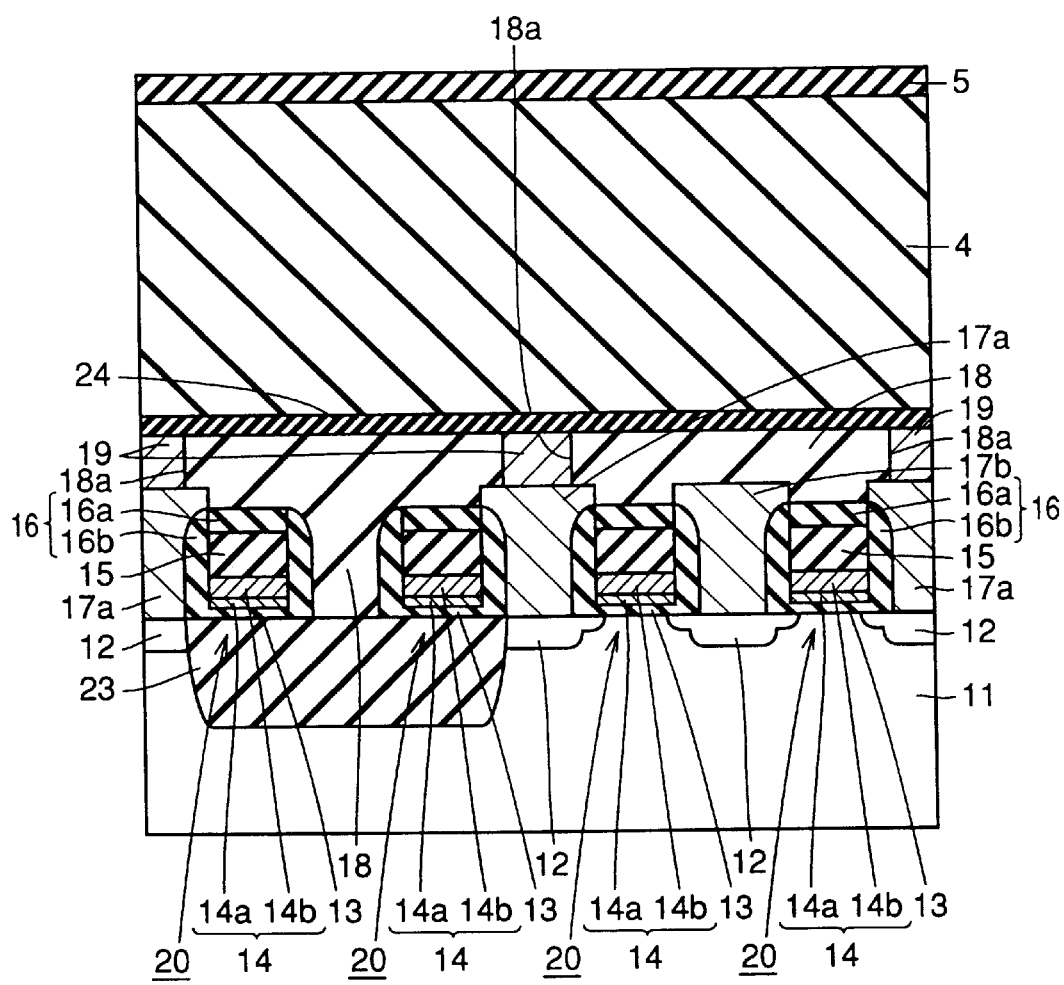
FIGS. 3 to 7 are schematic sectional views showing a method of manufacturing the semiconductor device having capacitors according to the first embodiment of the present invention in step order.

Referring to FIG. 3, the gate insulating layer 13 consisting of a silicon oxide film, for example, is formed on the surface of the silicon substrate 11 formed with the trench isolation 23. The doped polysilicon layer 14a, the tungsten silicide layer 14b, the silicon nitride film 15 and a silicon oxide film 16a are stacked on the gate insulating layer 13 and thereafter patterned by general photolithography and etching. Thus, the gate electrode layer (word line) 14 is formed from the doped polysilicon layer 14a and the tungsten silicide layer 14b. Thereafter an impurity is injected into the silicon substrate 11 through the gate electrode layer 14 etc. defining a mask, thereby forming an impurity region having relatively low concentration.

Silicon oxide films 16b in the form of side wall spacers consisting of silicon oxide films, for example, are formed to cover the side walls of the gate electrode 14. Thereafter an impurity is injected into the silicon substrate 11 through the gate electrode layer 14, the silicon oxide films 16b etc. defining masks, thereby forming an impurity region having relatively high concentration. This impurity region having relatively high concentration and the aforementioned impurity region having relatively low concentration form the pair of source/drain regions 12 having an LDD structure.

Thereafter the pad layer 17a and the bit line 17b are formed to come into contact with the pair of source/drain regions 12 respectively. The interlayer isolation layer 18 is formed to cover the pad layer 17a, the bit line 17b and the MOS transistor 20. The hole 18a exposing the upper surface of the pad layer 17a is formed in the interlayer isolation layer 18 by general photolithography and etching. The plug layer 19 is embedded in the hole 18a.

Thereafter the silicon nitride film 24 is formed in a thickness of 30 to 50 nm, for example, the BPTEOS film 4 is formed in a thickness of 1 to 2 $\mu$m, for example, and the TEOS film 5 is formed in a thickness of 100 to 400 nm, for example.

Figure 4:
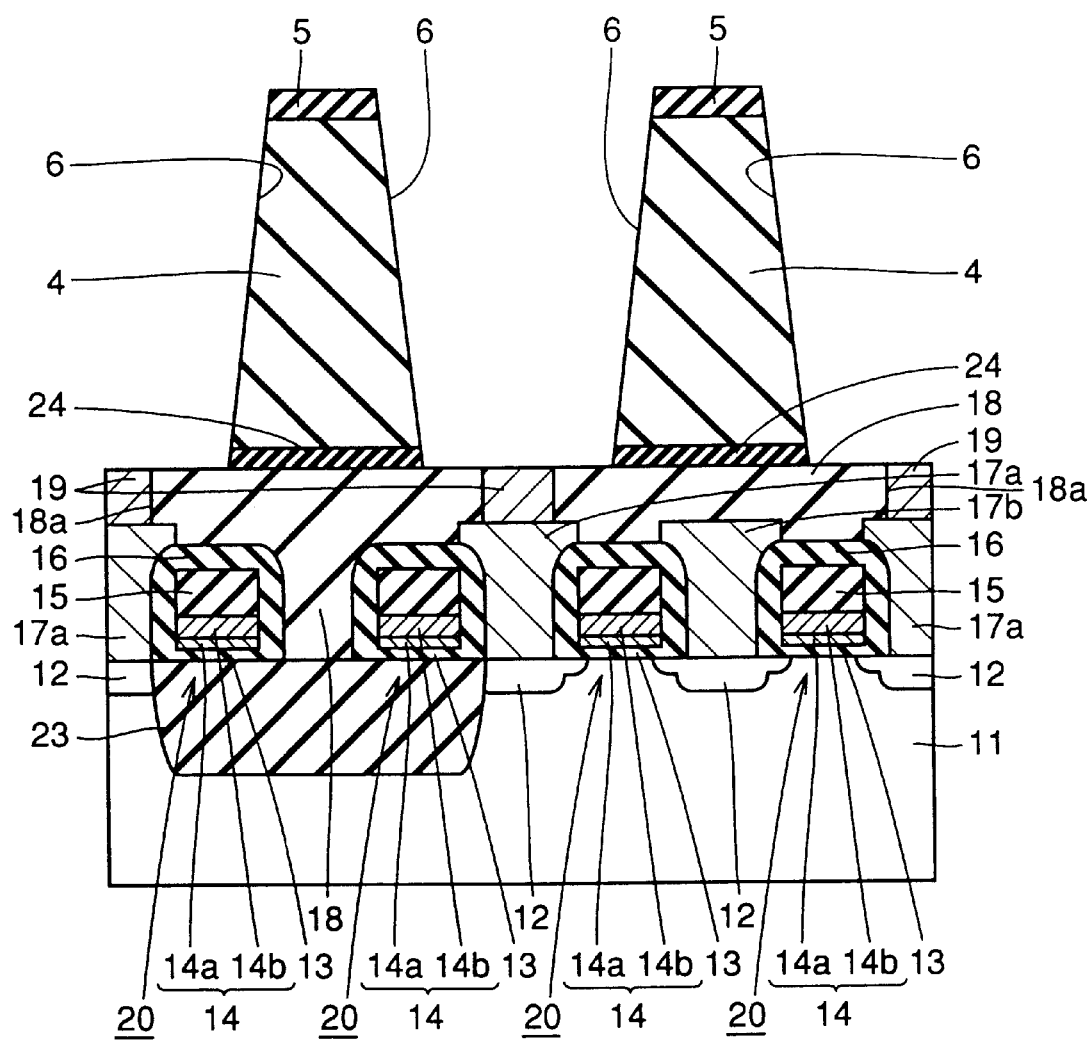

Referring to FIG. 4, the silicon nitride film 24, the BPTEOS film 4 and the TEOS film 5 are patterned by general photolithography and etching (e.g., dry etching), for forming the opening 6 for the storage node 1 exposing the upper surfaces of the interlayer isolation layer 18 and the plug layer 19. The silicon nitride film 24 serves as an etching stopper when etching the BPTEOS film 4 and the TEOS film 5.

Figure 5:
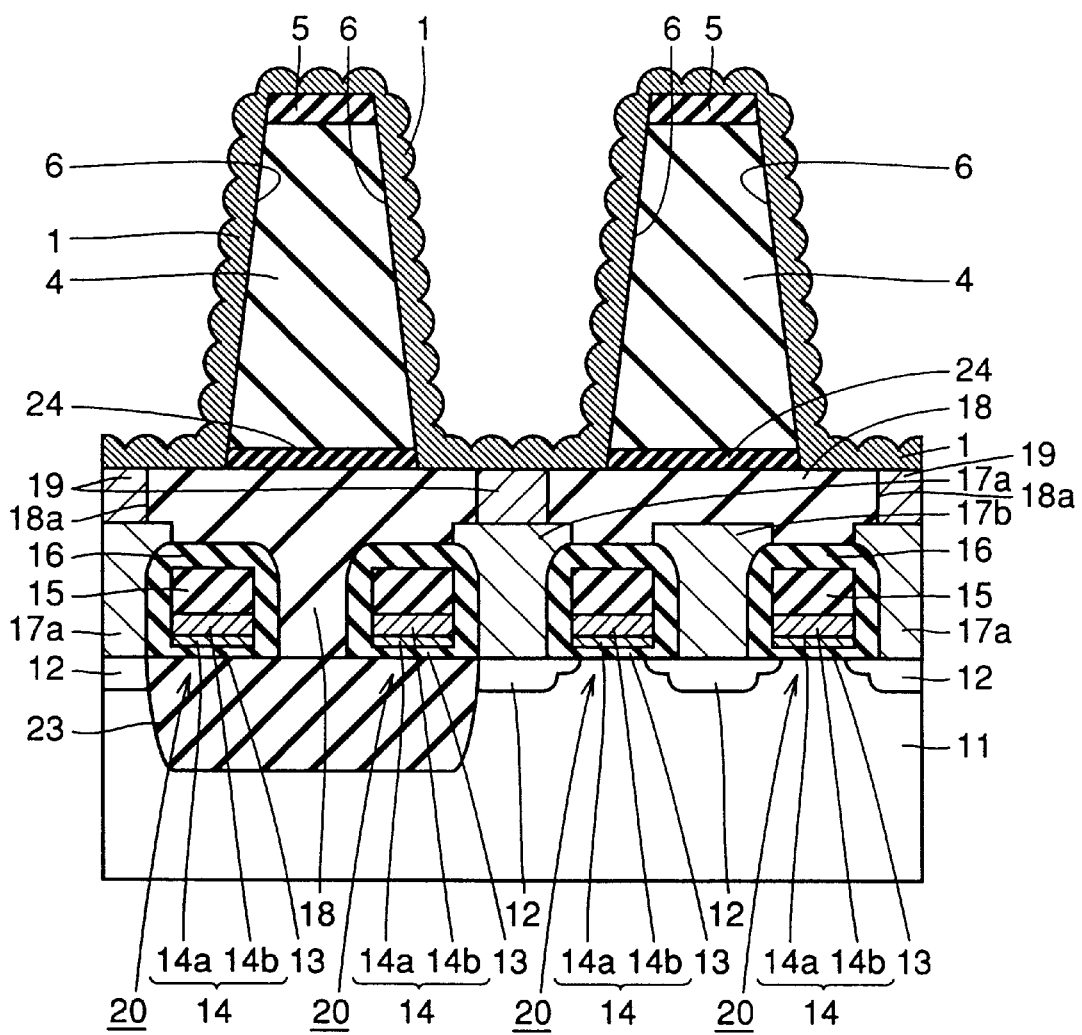

Referring to FIG. 5, a doped amorphous silicon layer 1 is formed on the overall surface. Thereafter cyanide gas is sprayed thereby crystallizing the doped amorphous silicon layer 1 and making grain growth on the surface for forming a doped polysilicon layer 1 having a roughened surface.

Figure 6:
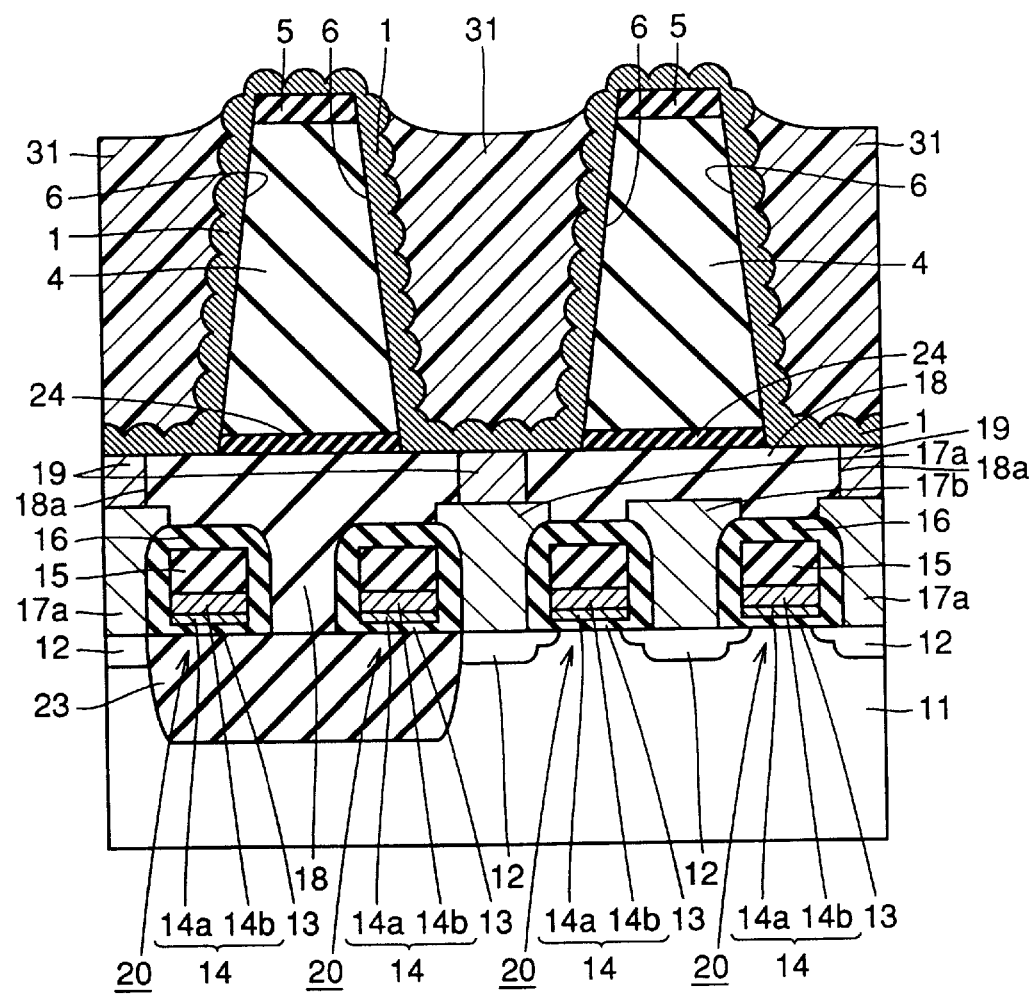

Referring to FIG. 6, photoresist 31 is embedded in the opening 6. In this case, etchback is performed through the photoresist 31 defining a mask until the upper surface of the TEOS film 5 is exposed. Thereafter the photoresist 31 is removed by ashing, for example.

Figure 7:
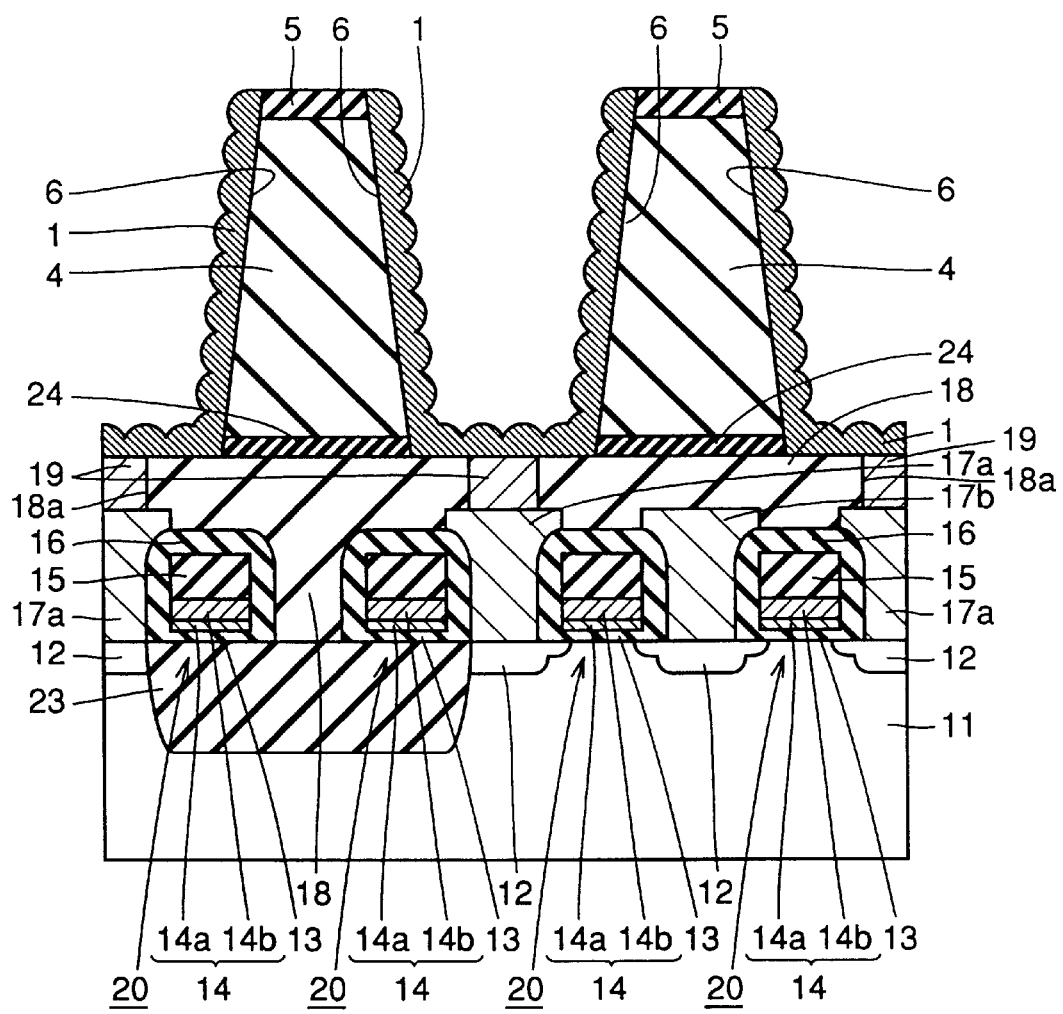

Referring to FIG. 7, the upper surface of the TEOS film 5 is exposed through the aforementioned etchback step, for forming the storage node 1 consisting of the doped polysilicon layer having a roughened surface. Thereafter a natural oxide film is removed by etching with aqueous hydrofluoric acid. The capacitor dielectric layer 2 having a multilayer structure of a silicon oxide film and a silicon nitride film, for example, and the cell plate 3 consisting of a doped polysilicon layer, for example, are formed by CVD as shown in FIG. 1, for completing a semiconductor device having the capacitor 10.

According to this embodiment, the TEOS film 5 is formed on the BPTEOS film 4 as shown in FIG. 7. The TEOS film 5 is made of a material more hardly etched by hydrofluoric acid than the BPTEOS film 4. Also when etching the natural oxide film formed on the storage node 1 with aqueous hydrofluoric acid, therefore, the upper surface of the TEOS film 5 can be prevented from remarkably retreating by the etching.

Further, hydrofluoric acid, containing no ammonium fluoride dissimilarly to BHF, hardly etches silicon. In the etching with aqueous hydrofluoric acid, therefore, the crystal grains arranged on the surface of the storage node 1 are prevented from separating from an underlayer silicon layer. Therefore, the storage node 1 is prevented from being shorted to another storage node, and a semiconductor device having high reliability can be obtained.

In the etching with aqueous hydrofluoric acid for removing the natural oxide film, silicon forming the storage node 1 is hardly etched. Therefore, the size (grain size) A of the crystal grains on the surface of the storage node 1 after formation of the capacitor dielectric layer 2 shown in FIGS. 1 and 2 can be substantially identical to or slightly smaller than the size of the crystal grains on the surface of the storage node 1 immediately after the surface roughening shown in FIG. 5 so that the crystal grains do not separate from the underlayer silicon layer.

Such a grain size that the crystal grains on the surface of the storage node 1 do not separate from the underlayer silicon layer is at least 1/1000 of the grain size of the crystal grains on the surface of the storage node 1 immediately after the surface roughening. Assuming that d represents the grain size of the crystal grains on the surface of the storage node 1 immediately after the surface roughening, the grain size A of the crystal grains on the surface of the storage node 1 after formation of the capacitor dielectric layer 2 satisfies $d \geq A \geq d/1000$.

Second Embodiment

Figure 8:
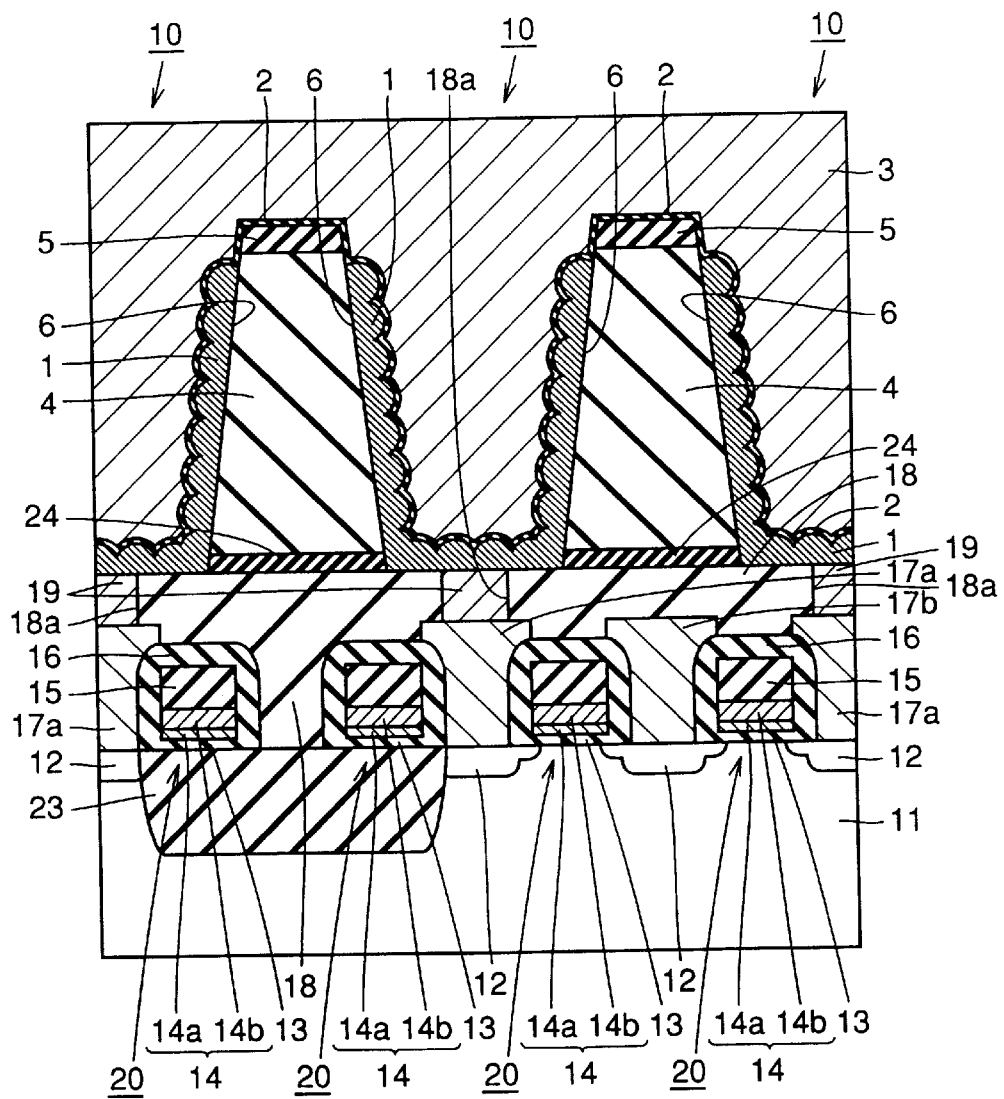
FIG. 8 is a sectional view schematically showing the structure of a semiconductor device having capacitors according to a second embodiment of the present invention.
Figure 9:
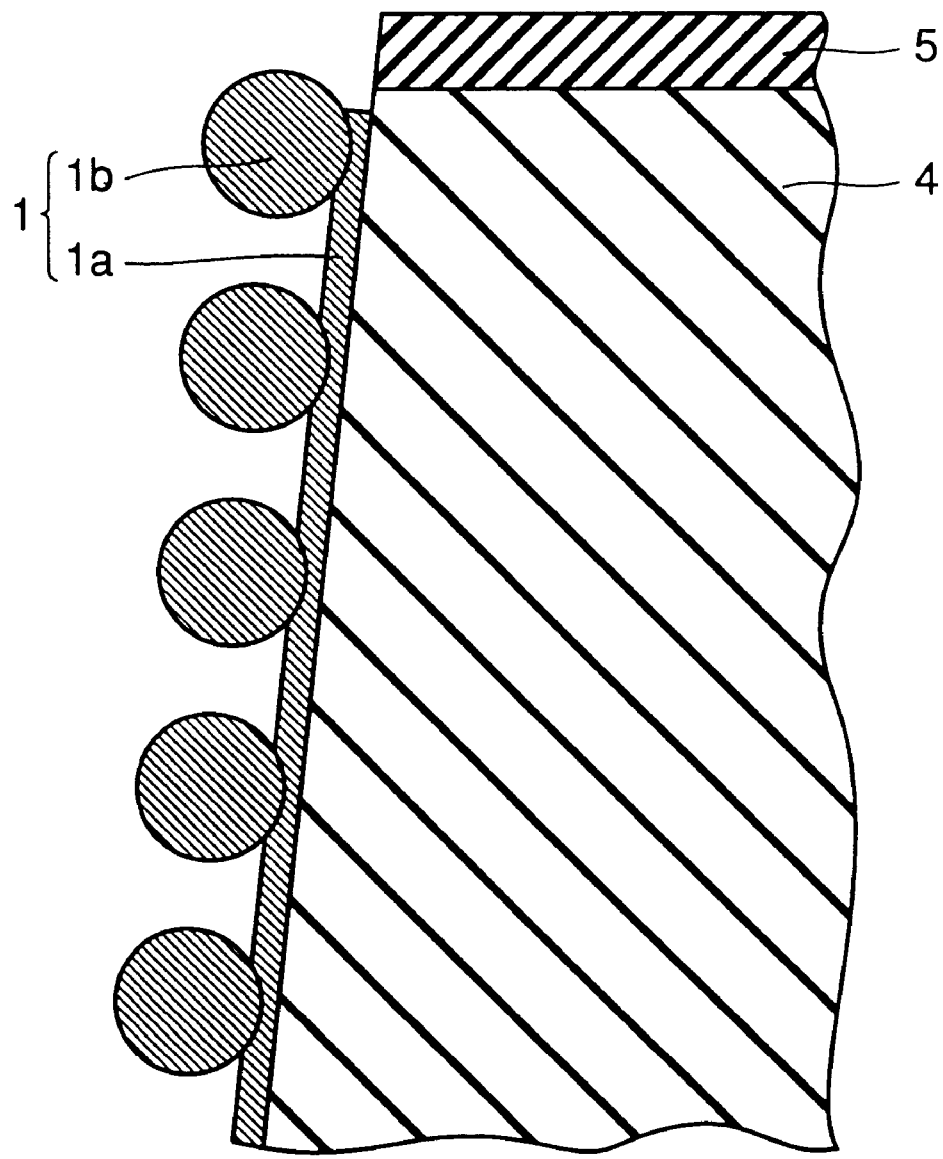
FIG. 9 illustrates the upper end of a storage node shown in FIG. 8 in an enlarged manner.

Referring to FIGS. 8 and 9, a semiconductor device according to a second embodiment of the present invention is different from the structure of the first embodiment shown in FIG. 1 in a point that the upper end of each storage node 1 retreats downward in FIGS. 8 and 9 beyond the upper surface of a TEOS film 5.

The remaining structure of the second embodiment is substantially identical to that of the aforementioned first embodiment, and hence components identical to those of the first embodiment are denoted by the same reference numerals and redundant description is not repeated.

A manufacturing method according to this embodiment is now described.

In the method according to this embodiment, steps similar to those of the first embodiment shown FIGS. 3 to 6 are carried out. Referring to FIG. 6, isotropic etching is performed on the overall surface with photoresist 31 embedded in an opening 6. This isotropic etching is performed by wet etching with $NH_4OH$, for example.

Figure 10:
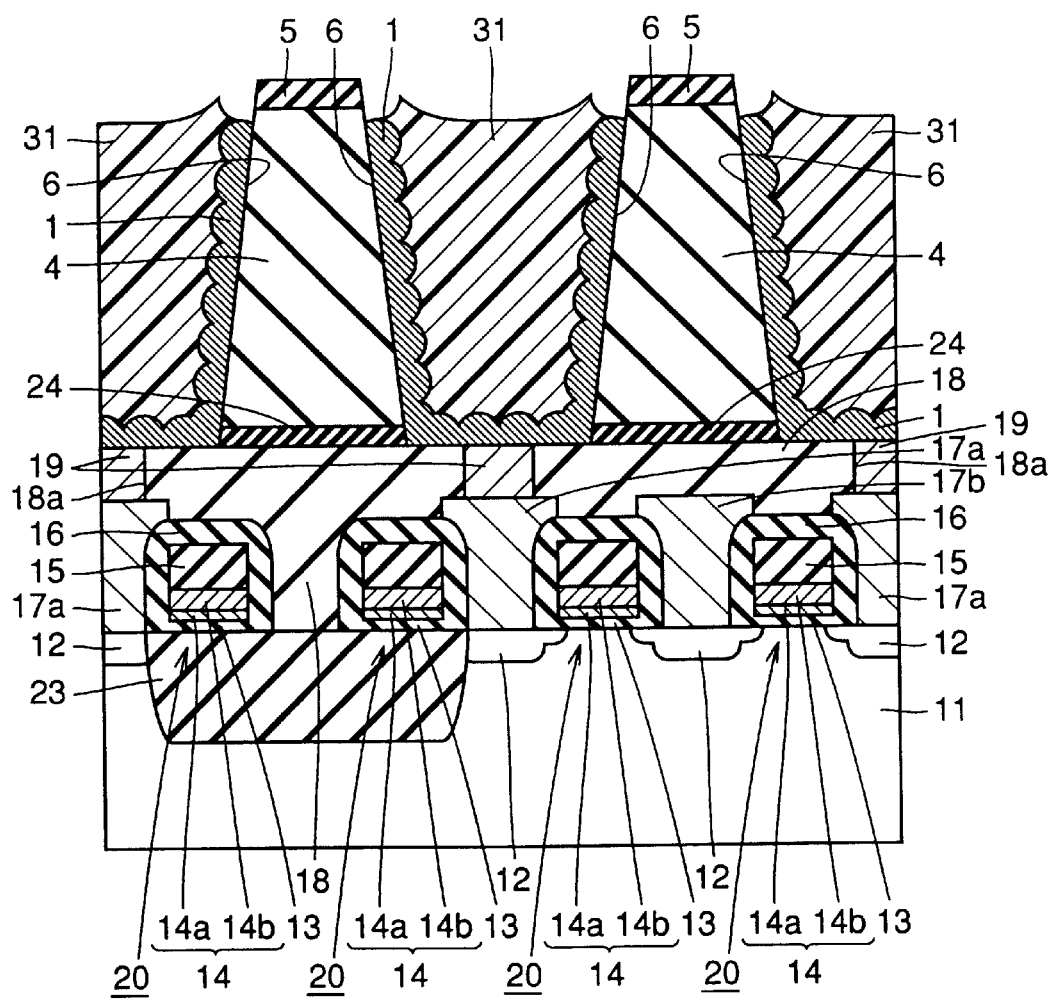
FIG. 10 is a schematic sectional view showing a method of manufacturing the semiconductor device having capacitors according to the second embodiment of the present invention.

Referring to FIG. 10, the side wall of a pattern etc. is prevented from formation of a residue in the isotropic etching. Thus, no sharp forward end of a storage node 1 remains on the side walls of a BPTEOS film 4 and a TEOS film 5. Further, the upper end of the storage node 1 retreats downward in FIG. 10 beyond the upper surface of the TEOS film 5. Thereafter the photoresist 31 is removed for completing the semiconductor device having capacitors 10 according to the second embodiment shown in FIGS. 8 and 9.

Figure 32:
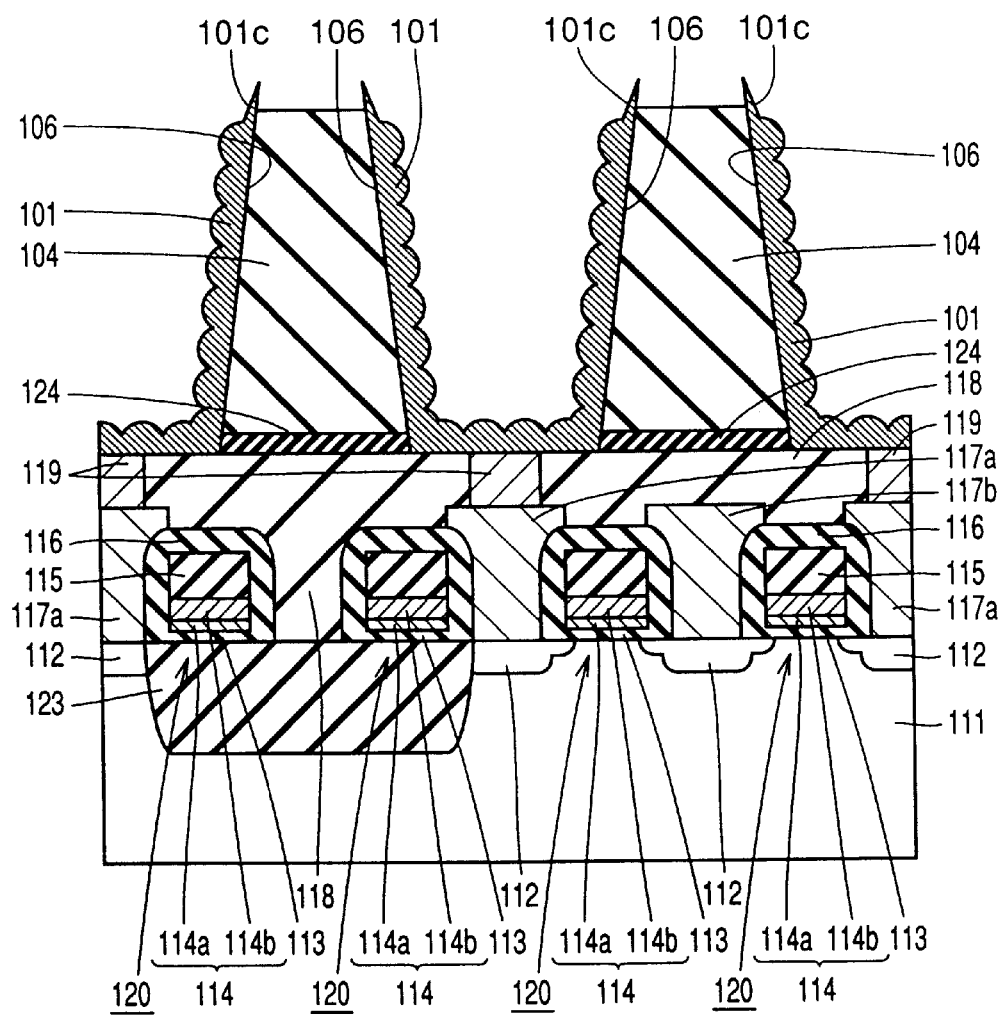
FIG. 32 is a schematic sectional view showing the forward end of the storage node projecting beyond the upper surface of an insulating layer.
Figure 33:
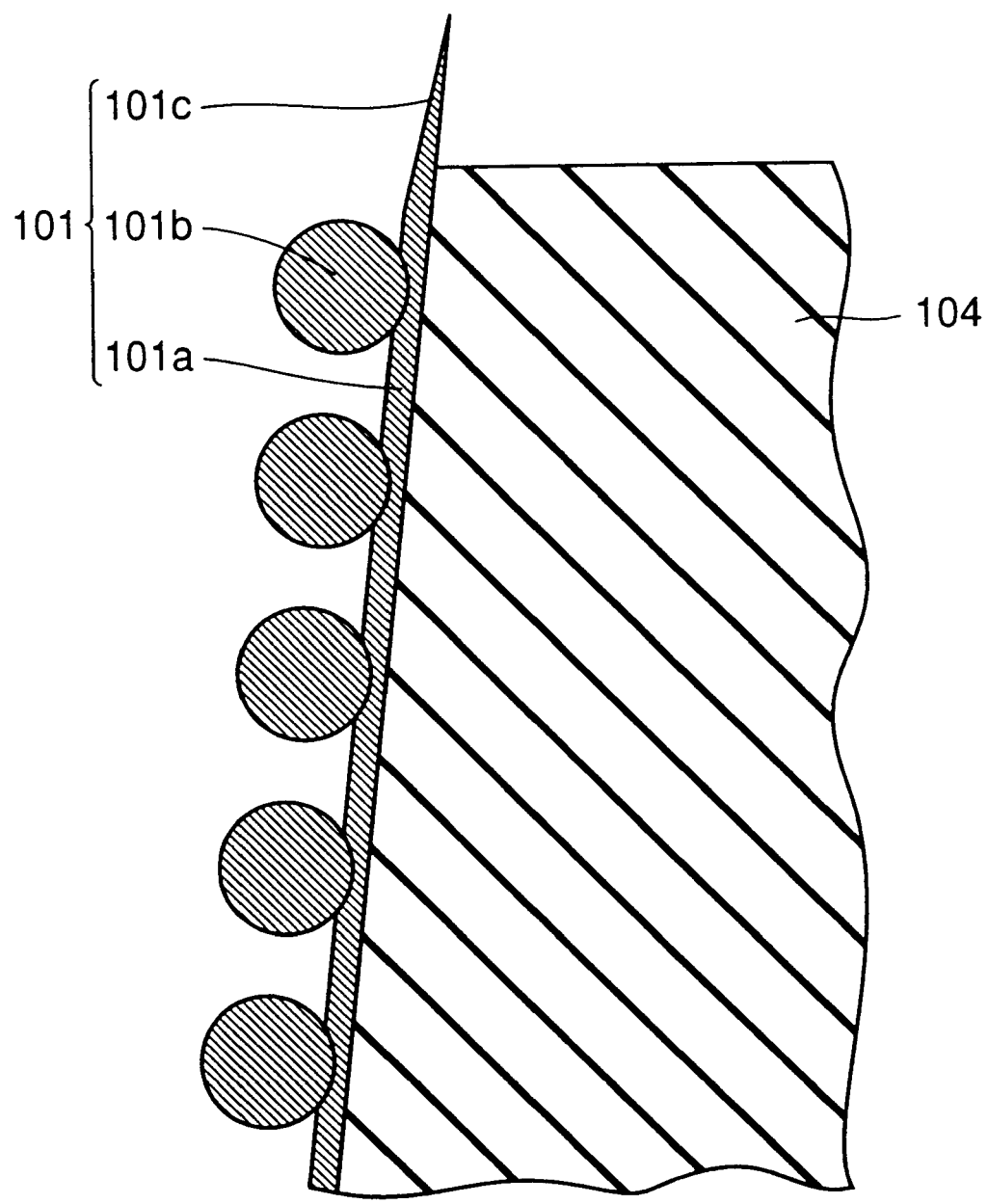
FIG. 33 illustrates the projecting forward end in an enlarged manner.
Figure 34:
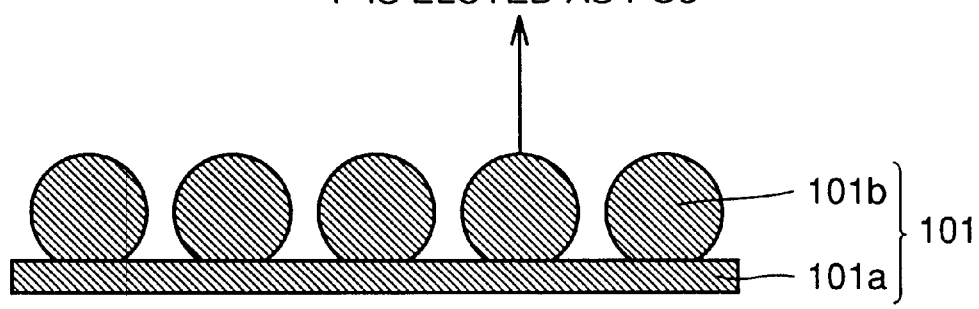
FIG. 34 illustrates phosphorus eluted from the storage node into aqueous hydrofluoric acid.
Figure 35:
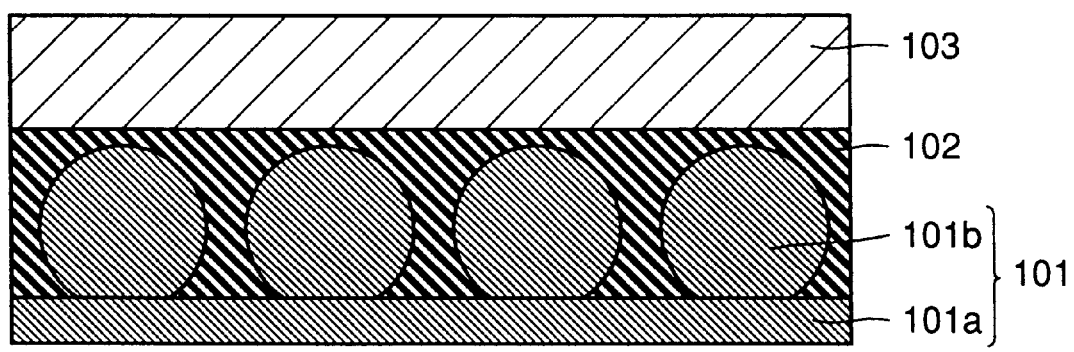
FIG. 35 illustrates crystal grains arranged on the surface of the storage node at a narrow space.

According to this embodiment, etching for forming the storage node 1 is isotropically performed as shown in FIG. 10. Therefore, no sharp forward end 101 shown in FIGS. 32 and 33 is formed on the side walls of the BPTEOS film 4 and the TEOS film 5. Therefore, the storage node 1 is not shorted to another storage node due to breakage of such a sharp forward end 101, and a semiconductor device having high reliability can be obtained.

Third Embodiment

The structure of a semiconductor device having capacitors according to a third embodiment of the present invention is different from the structure of the second embodiment shown in FIGS. 8 and 9 in impurity concentration in a storage node 1. According to this embodiment, phosphorus, for example, is introduced into the storage node 1 in concentration (about $1 \times 10^{21}$ cm$^{-3}$) of the solubility limit of silicon. The impurity introduced into the storage node 1 is not restricted to phosphorus but As (arsenic) or B (boron) may alternatively be introduced in impurity concentration of the solubility limit.

The remaining structure of this embodiment is substantially identical to the aforementioned structure of the second embodiment, and hence components identical to those of the second embodiment are denoted by the same reference numerals and redundant description is not repeated.

A manufacturing method according to this embodiment is now described.

Figure 11:
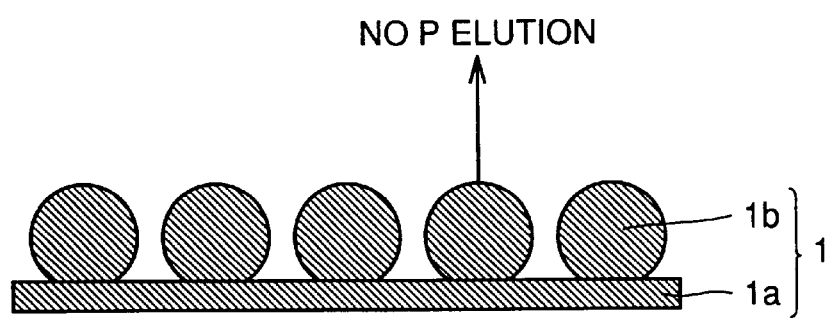
FIG. 11 is a diagram of a storage node part showing a method of manufacturing a semiconductor device having capacitors according to a third embodiment of the present invention.

In the method according to this embodiment, steps similar to those of the first embodiment shown in FIGS. 3 to 6 are first carried out and thereafter a step similar to that of the second embodiment shown in FIG. 10 is carried out. Thus, the storage node 1 consisting of doped polysilicon having a roughened surface is formed. Photoresist 31 is removed from this state and thereafter a natural oxide film is removed by etching with a solution (HF+H$_2$O+P) prepared by adding phosphorus to aqueous hydrofluoric acid, as shown in FIG. 11.

Phosphorus, previously added to the solution for saturating the same, reacts with water in the aqueous solution to previously form phosphoric acid (PO$_3$). In other words, water in the solution has already reacted with phosphorus, and hence phosphorus contained in the storage node 1 is prevented from being eluted into the solution as phosphoric acid.

Thereafter the semiconductor device having capacitors 10 according to this embodiment is completed similarly to that of the second embodiment shown in FIGS. 8 and 9 through later steps similar to those of the second embodiment.

According to this embodiment, etching is performed with the solution prepared by previously adding phosphorus to aqueous hydrofluoric acid for removing the natural oxide film, as described above. Therefore, phosphorus contained in the storage node 1 is prevented from being eluted into the solution as phosphoric acid, and can be kept in the impurity concentration of the solubility limit of silicon in the storage node 1. Thus, the storage node 1 has high conductivity, whereby a large capacitance can be ensured and a semiconductor device having high reliability can be obtained.

Fourth Embodiment

Figure 12:
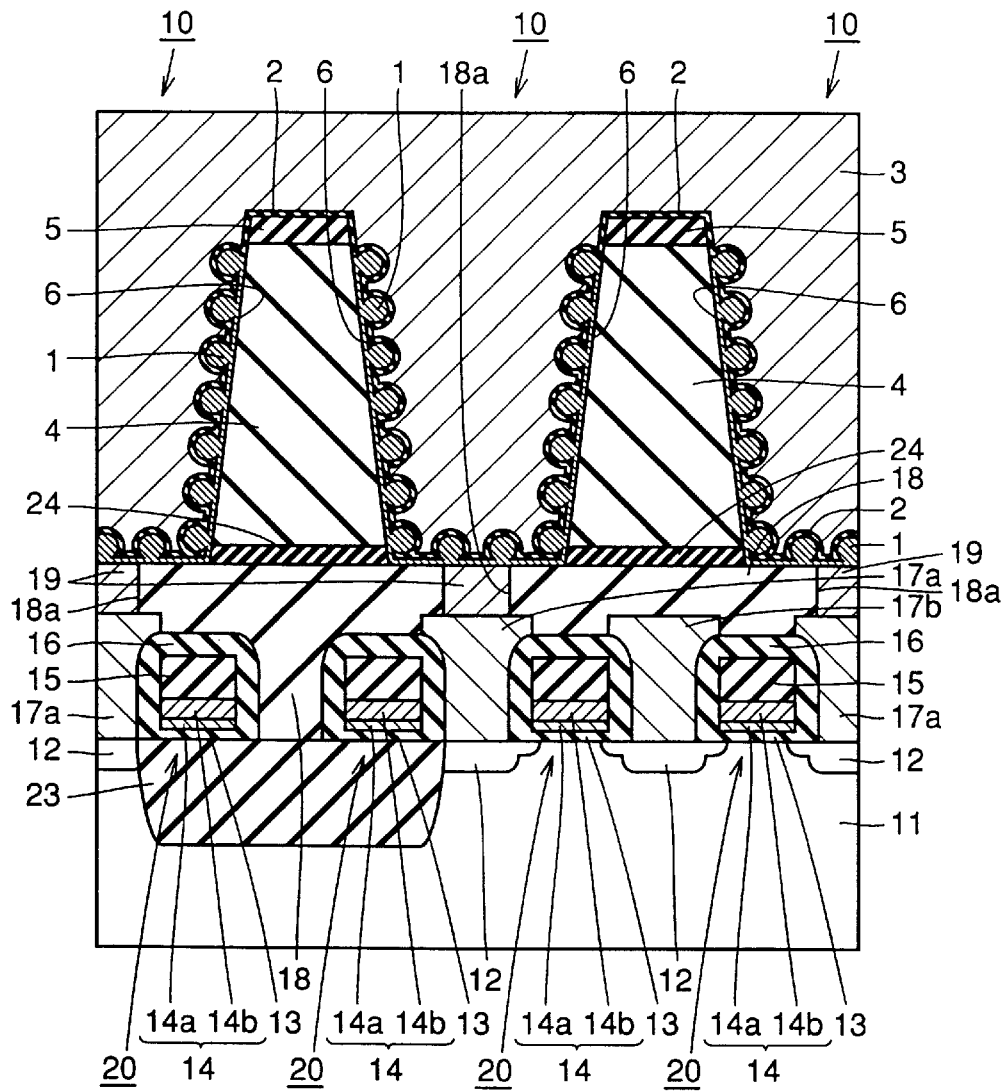
FIG. 12 is a sectional view schematically showing the structure of a semiconductor device having capacitors according to a fourth embodiment of the present invention.
Figure 13:
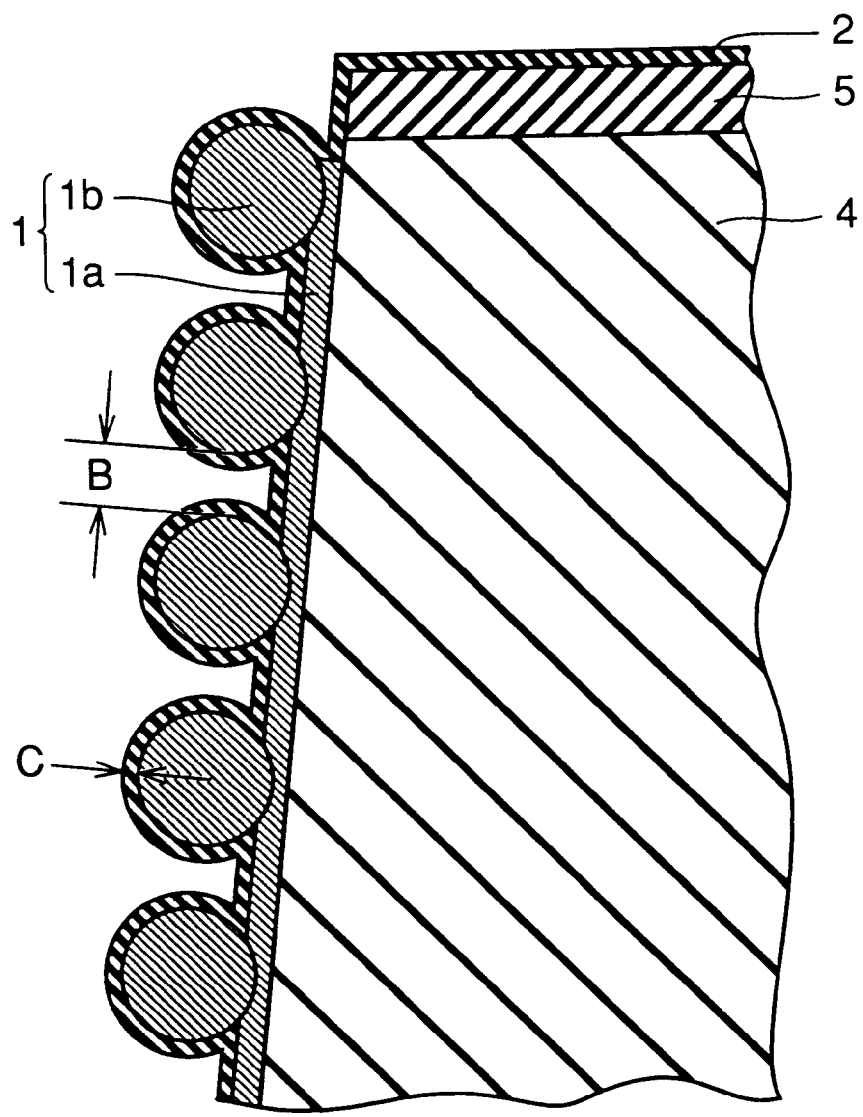
FIG. 13 illustrates the upper end of a storage node shown in FIG. 12 in an enlarged manner.

Referring to FIGS. 12 and 13, the structure of a semiconductor device according to a fourth embodiment of the present invention is different from that of the second embodiment shown in FIGS. 8 and 9 or the third embodiment in the space between crystal grains on the surface of a storage node 1 and the thickness of a capacitor dielectric layer 2. According to this embodiment, the relation between the space B between crystal grains 1b on the surface of a storage node 1 and the thickness C of a capacitor dielectric layer 2 shown in FIG. 13 satisfies B>2×C. Thus, a cell plate 3 fills up clearances between the crystal grains 1b on the surface of the storage node 1, so that the storage node 1 and the cell plate 3 are opposed to each other also on these portions.

The remaining structure of the fourth embodiment is substantially identical to the aforementioned structure of the second or third embodiment, and hence identical components are denoted by the same reference numerals and redundant description is not repeated.

A manufacturing method according to this embodiment is now described.

In the manufacturing method according to this embodiment, steps similar to those of the first embodiment shown in FIGS. 3 to 6 are carried out and thereafter a step similar to that of the second embodiment shown in FIG. 10 is carried out. Thus, the storage node 1 consisting of doped polysilicon having a roughened surface is formed. Photoresist 31 is removed from this state and thereafter the storage node 1 is etched with BHF, thereby controlling the space B between the crystal grains 1b on the surface of the storage node 1.

Thereafter a natural oxide film is removed with aqueous hydrofluoric acid or aqueous hydrofluoric acid containing phosphorus, and thereafter the capacitor dielectric layer 2 is formed by CVD to cover the surface of the storage node 1 as shown in FIGS. 12 and 13. The thickness C of the capacitor dielectric layer 2 is set to satisfy the relation B>2×C with the space B between the crystal grains 1b on the surface of the storage node 1. Thereafter the cell plate 3 consisting of doped polysilicon is formed by CVD, for completing the semiconductor device having capacitors 10 according to this embodiment.

According to this embodiment, the capacitor dielectric layer 2 having the thickness C less than half the space B between the crystal grains 1b on the surface of the storage node 1 is not completely embedded in the clearances between the crystal grains 1b. Therefore, the cell plate 3 can fill up the clearances between the crystal grains 1b, and the opposed areas of the storage node 1 and the cell plate 3 can be increased. Thus, a large capacitance can be ensured and a semiconductor device having high reliability can be obtained.

Fifth Embodiment

Figure 14:
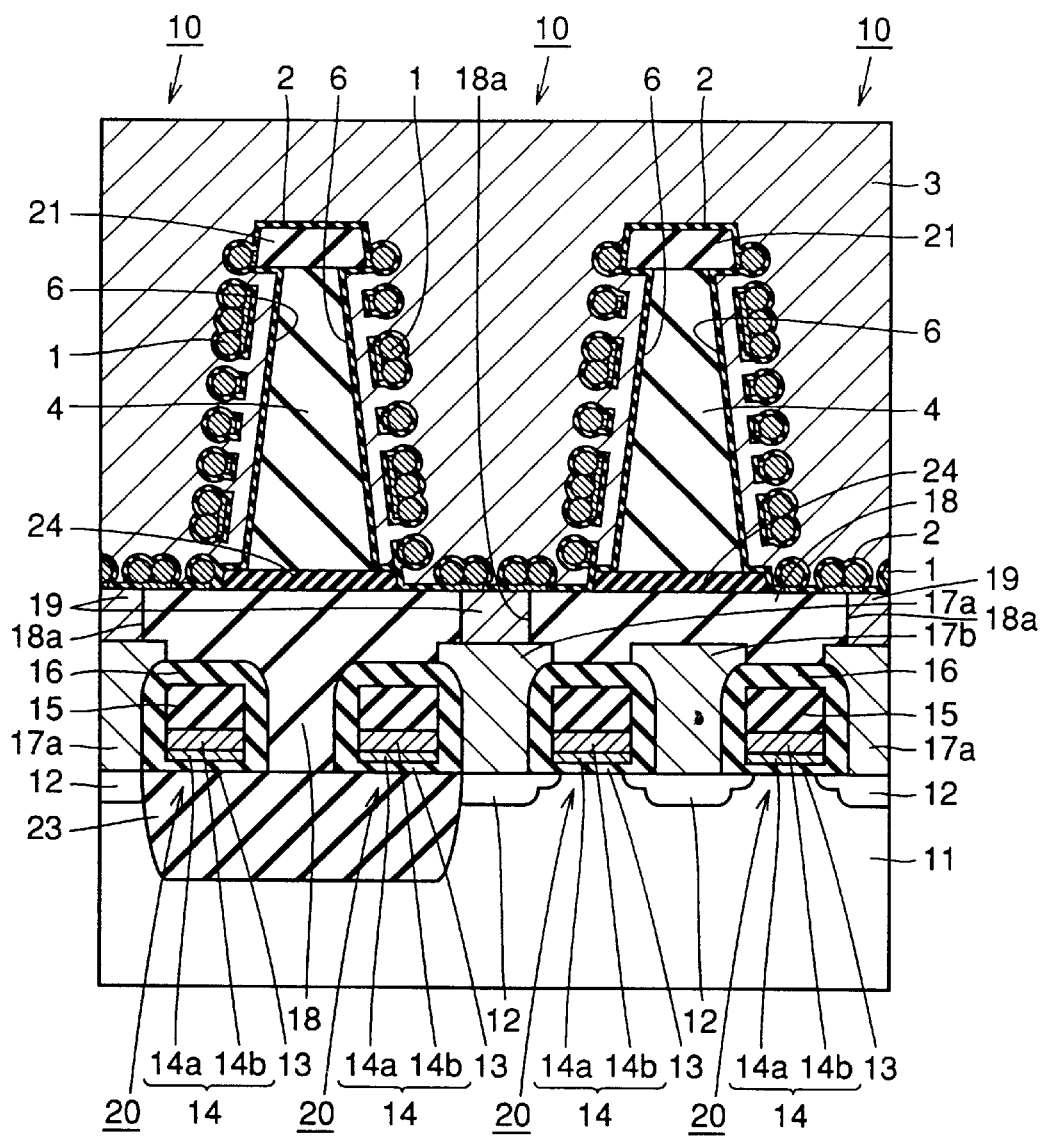
FIG. 14 is a sectional view schematically showing the structure of a semiconductor device having capacitors according to a fifth embodiment of the present invention.
Figure 15:
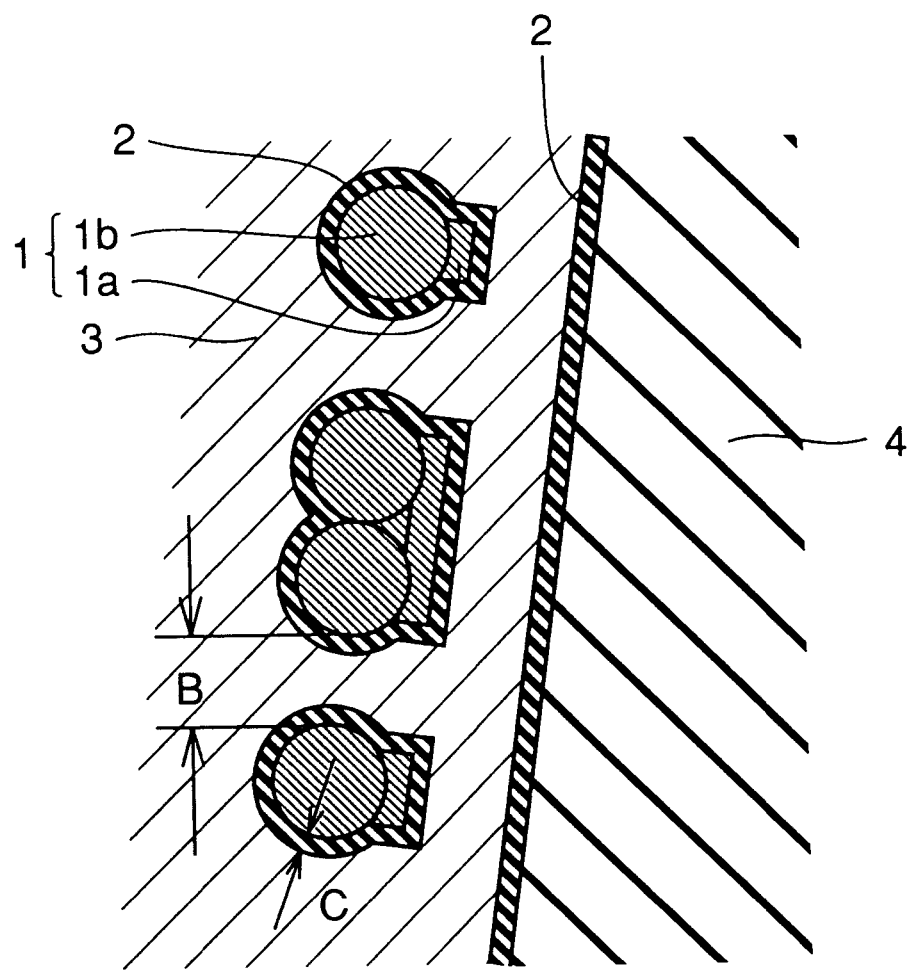
FIG. 15 illustrates a storage node shown in FIG. 14 in an enlarged manner.

Referring to FIGS. 14 and 15, the structure of a semiconductor device according to a fifth embodiment of the present invention is different from that of the fourth embodiment shown in FIGS. 12 and 13 in a point that holes are formed in each storage node 1, a point that a silicon nitride film 21 is formed on a BPTEOS film 4 and a point that a capacitor dielectric layer 2 and a cell plate 3 are located between the storage node 1 and the side surface of the BPTEOS film 4.

According to the structure of this embodiment, underlayers 1a or crystal grains 1b are connected with each other in non-illustrated regions to form the storage node 1 having holes. The space B between the crystal grains 1b and the thickness C of the capacitor dielectric layer 2 satisfy the relation B>2×C. Thus, the cell plate 3 fills up clearances between the crystal grains 1b.

A space is defined between the storage node 1 and the BPTEOS film 4, and the cell plate 3 also fills up this space to be opposed to the storage node 1 through the capacitor dielectric layer 2. The upper end of the storage node 1 is in contact with the side surface of the silicon nitride film 21.

The thickness of the silicon nitride film 21 formed on the BPTEOS film 4 is 100 to 400 nm, for example.

The remaining structure of the fifth embodiment is substantially identical to the aforementioned structure of the fourth embodiment, and hence identical components are denoted by the same reference numerals and redundant description is not repeated.

A manufacturing method according to this embodiment is now described.

Figure 16:
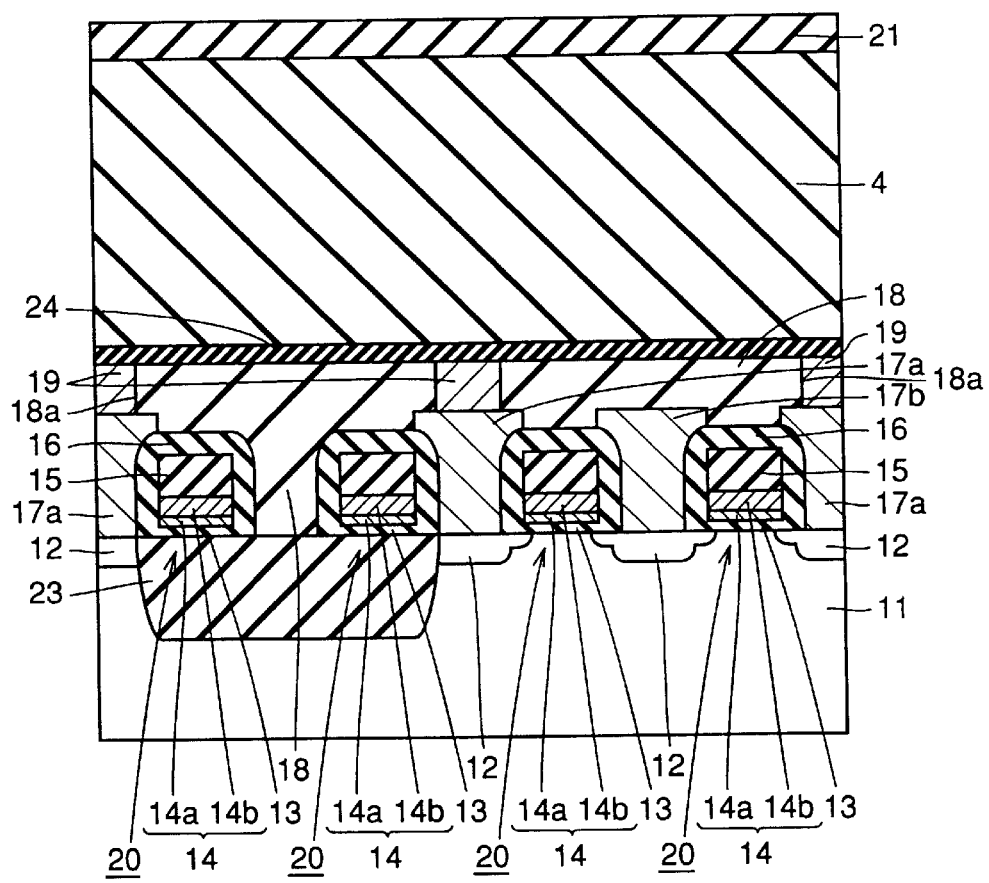
FIGS. 16 to 22 are schematic sectional views showing a method of manufacturing the semiconductor device having capacitors according to the fifth embodiment of the present invention in step order.

Referring to FIG. 16, an interlayer isolation layer 18 is formed to cover a MOS transistor 20, a pad layer 17a, a bit line 17b and the like, and a plug layer 19 is formed similarly to the first embodiment. Thereafter a silicon nitride film 24 is formed in a thickness of 30 to 50 nm, the BPTEOS film 4 is formed in a thickness of 1 to 2 $\mu$m, and the silicon nitride film 21 is formed on the BPTEOS film 4 in a thickness of 100 to 400 nm.

Figure 17:
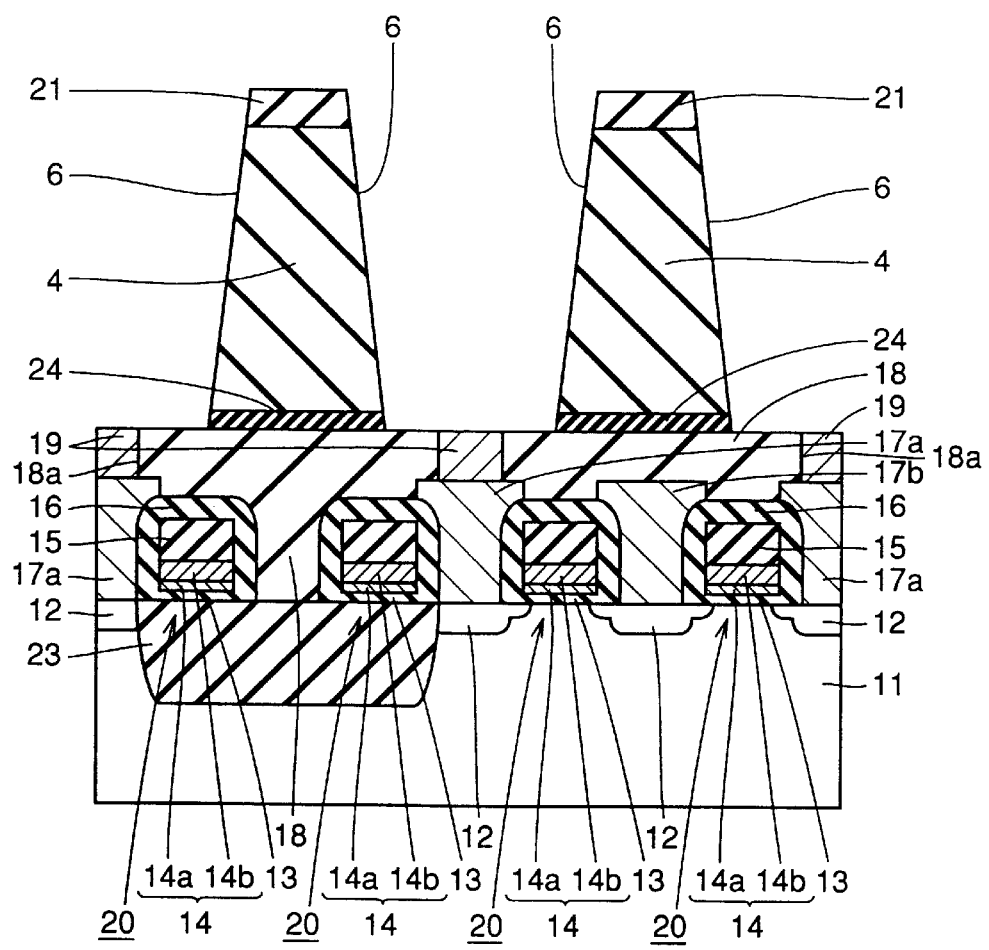

Referring to FIG. 17, the silicon nitride film 24, the BPTEOS film 4 and the silicon nitride film 21 are patterned by general photolithography and etching, for forming an opening 6 for the storage node 1.

Figure 18:
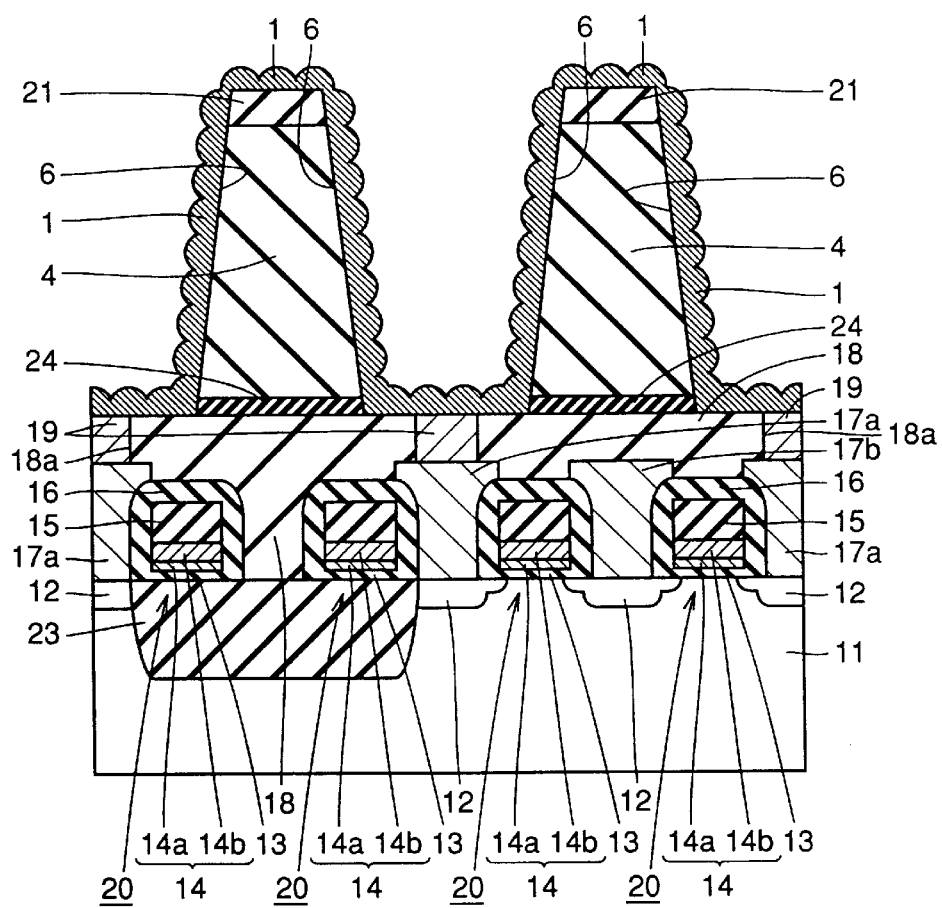

Referring to FIG. 18, a doped amorphous silicon layer 1 is formed on the overall surface. Thereafter cyanide gas is sprayed thereby polycrystallizing the doped amorphous silicon layer 1 for forming a doped polysilicon layer 1 having a surface roughened by growth of crystal grains.

Figure 19:
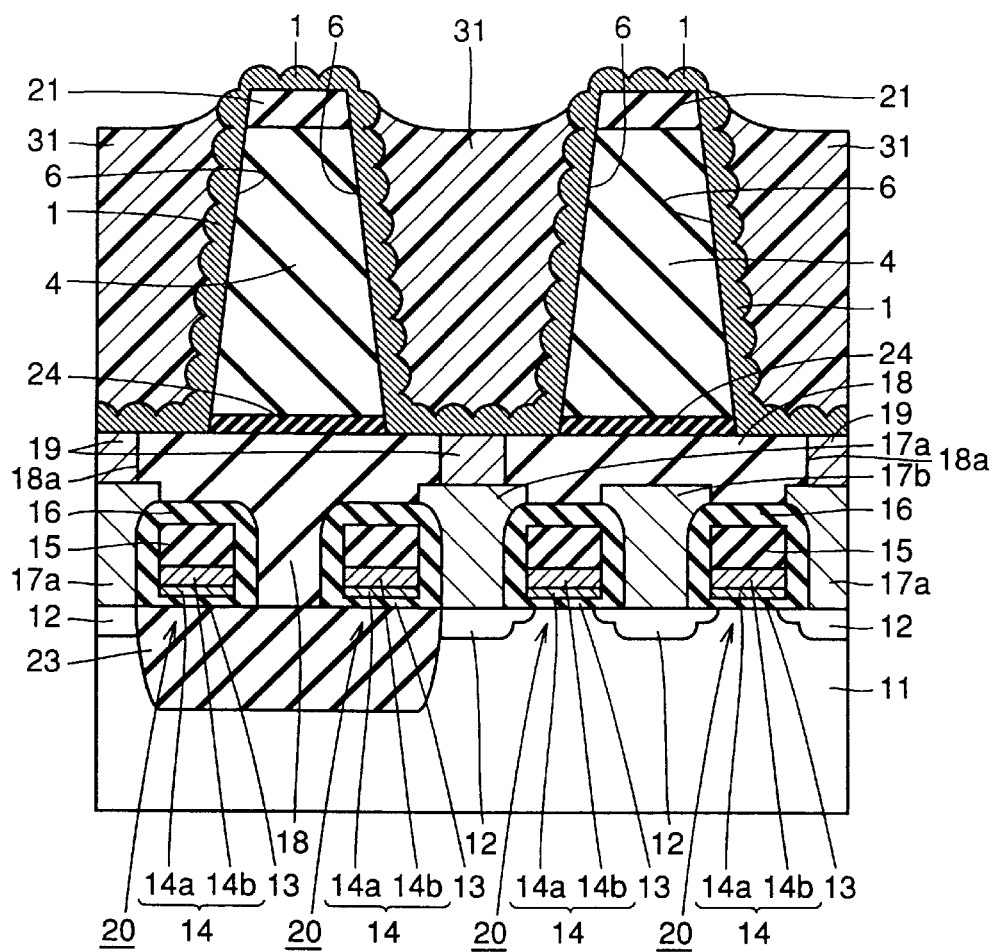

Referring to FIG. 19, photoresist 31 is embedded in the opening 6. In this state, etchback is performed through the photoresist 31 defining a mask until the upper surface of the silicon nitride film 21 is exposed. Thereafter the photoresist 31 is removed by ashing, for example.

Figure 20:
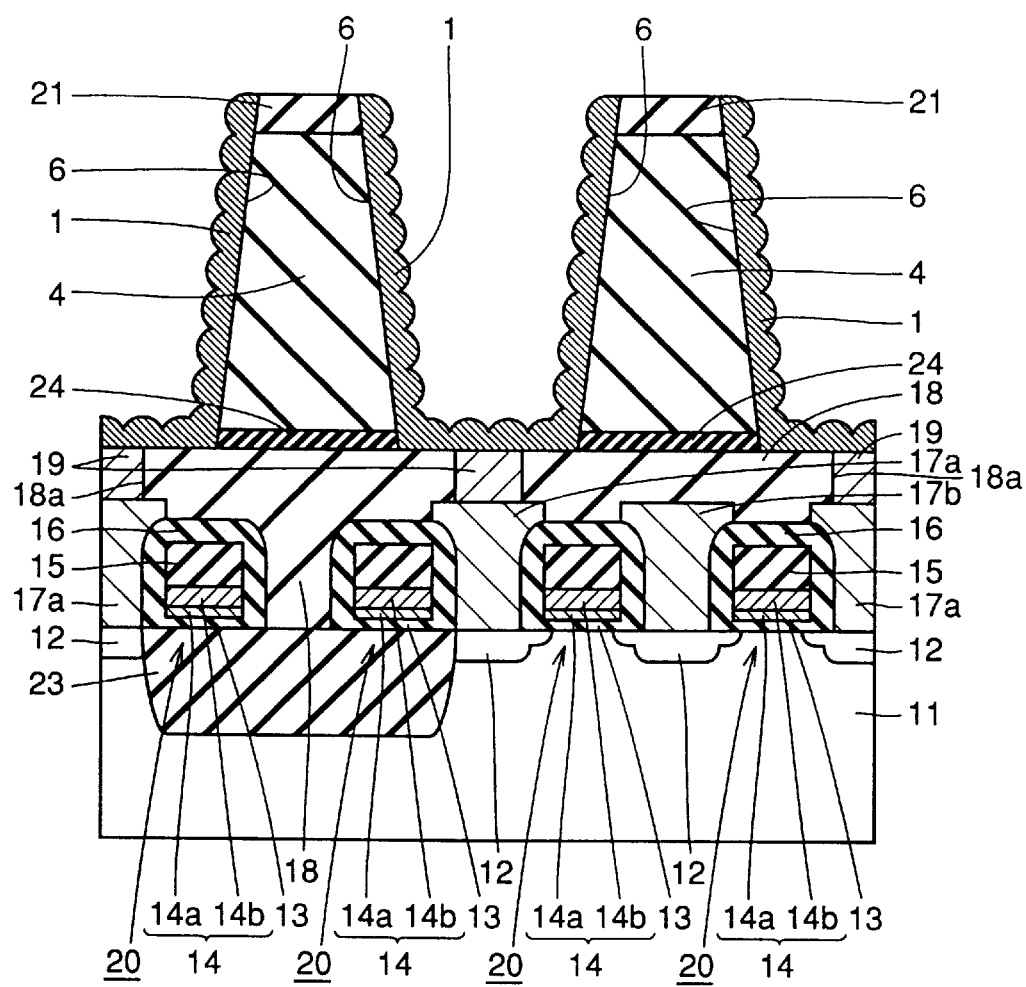

Referring to FIG. 20, the doped polysilicon layer 1 is left only in the opening 6 through the aforementioned etchback step, to form the storage node 1. Thereafter the storage node 1 is etched with BHF.

Figure 21:
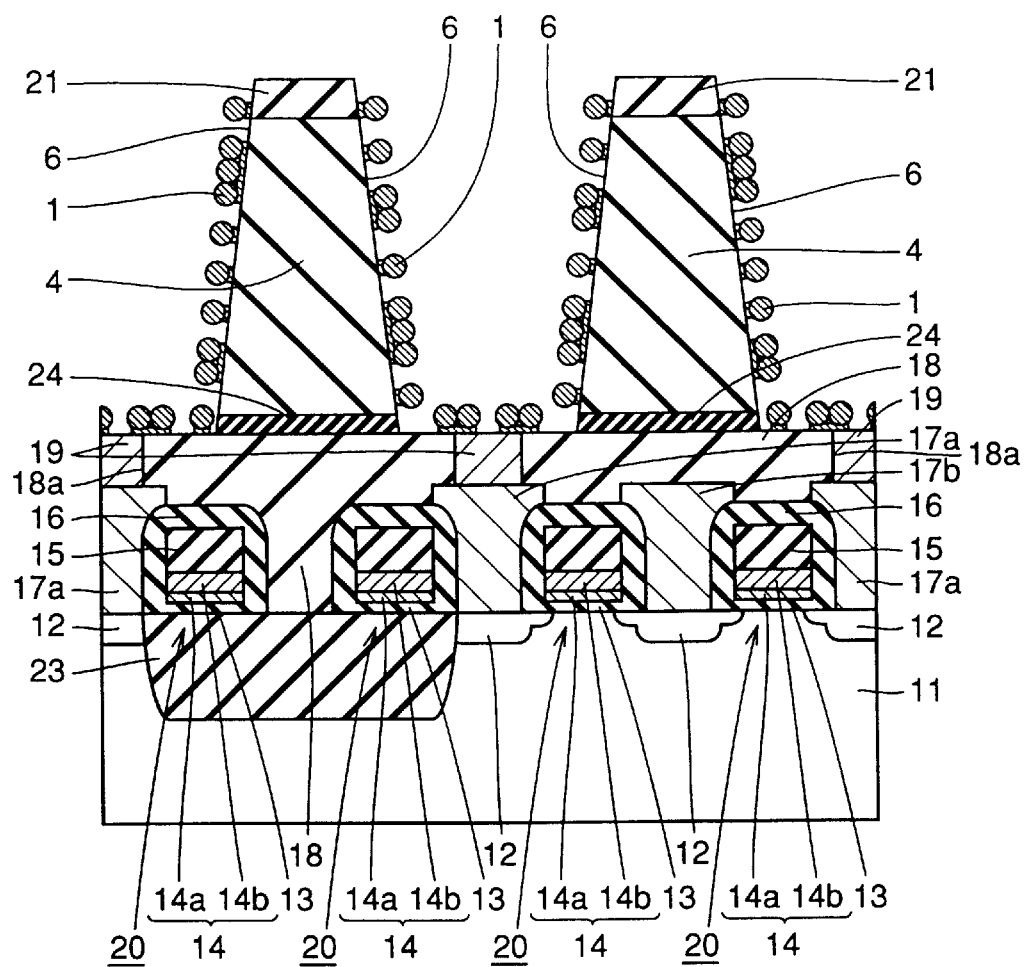

Referring to FIG. 21, the space B between the crystal grains 1b on the surface of the storage node 1 is controlled. While the storage node 1 has holes from the time of surface roughening, the diameter of the holes is enlarged due to the etching with BHF. Thereafter etching is performed with aqueous hydrofluoric acid or aqueous hydrofluoric acid containing phosphorus.

Figure 22:
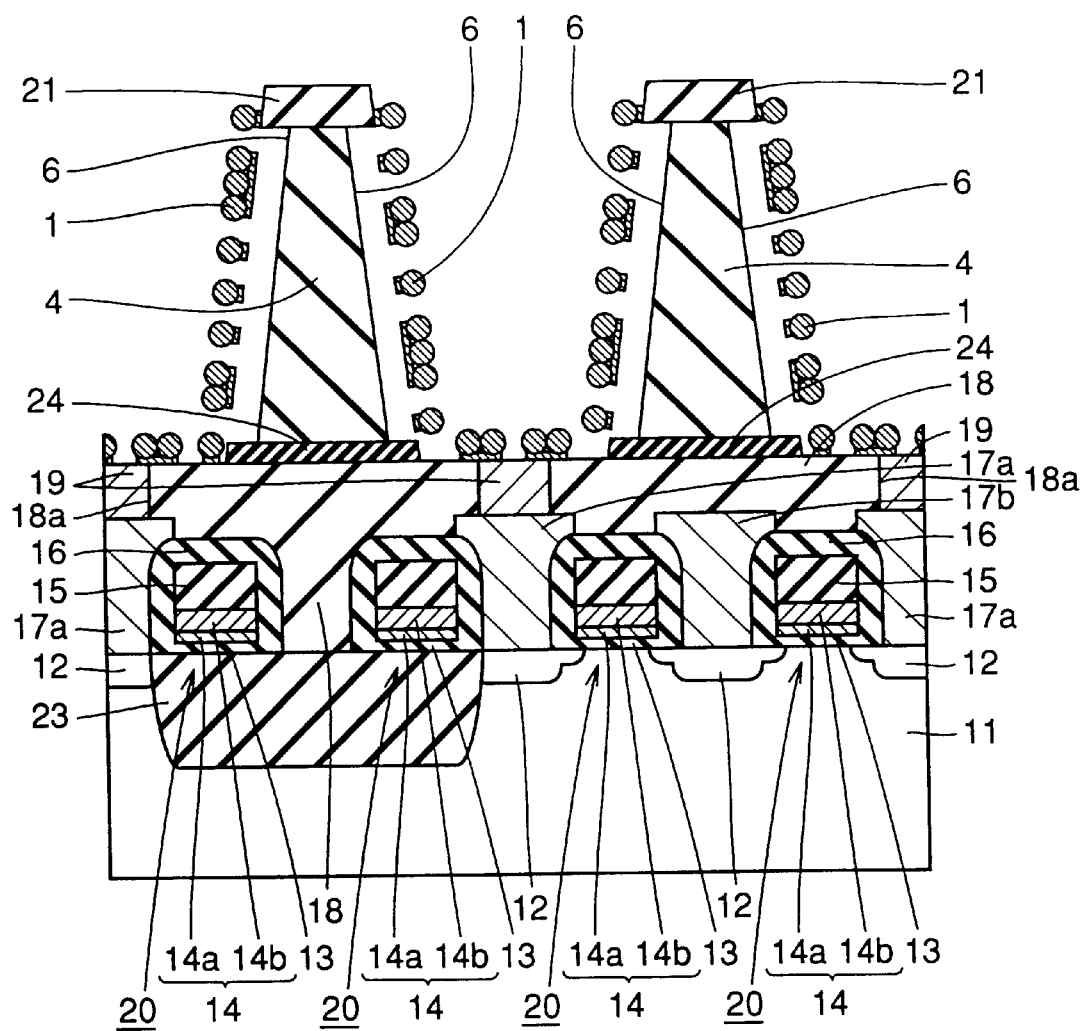
Figure 23:
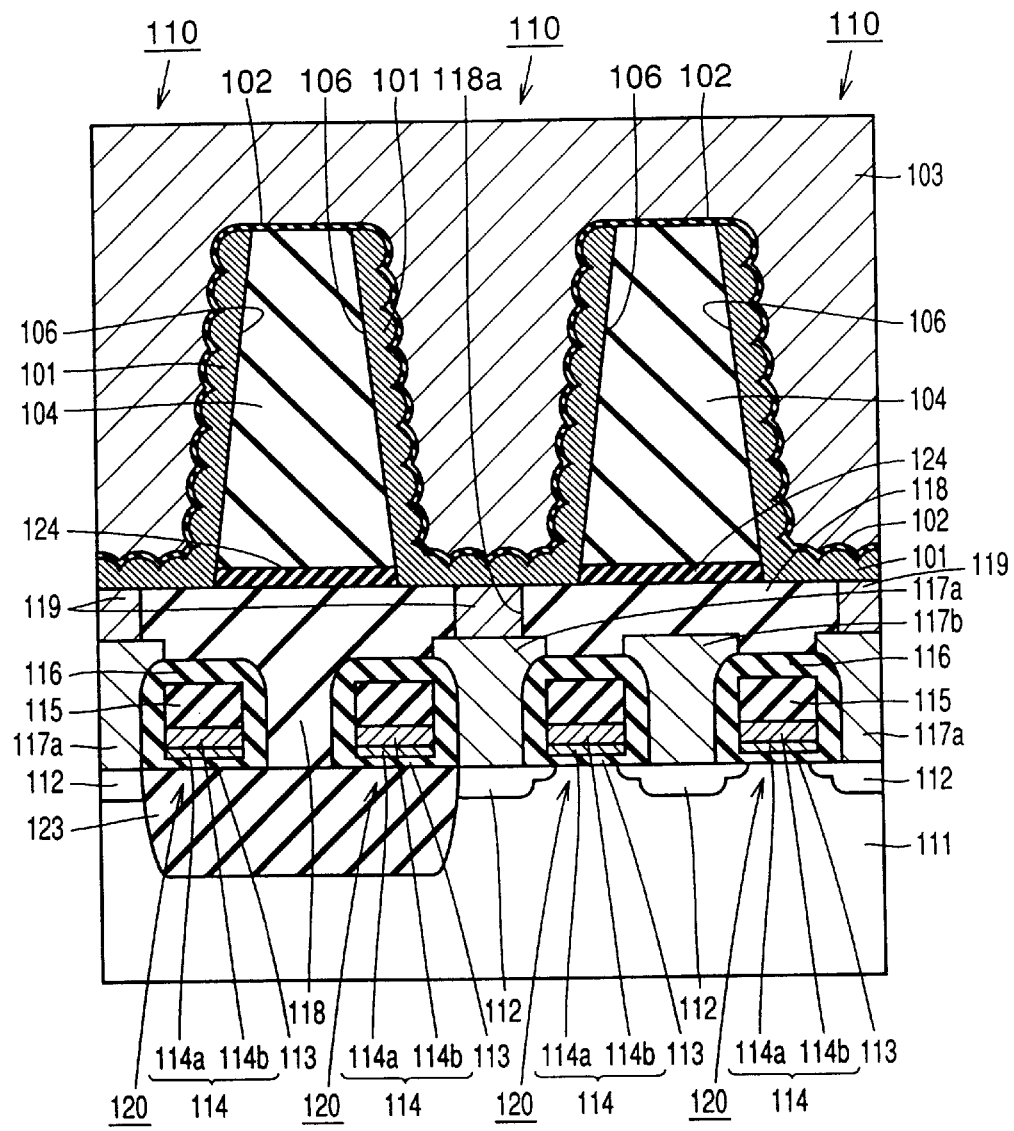
FIG. 23 is a sectional view schematically showing the structure of a conventional semiconductor device having capacitors.
Figure 24:
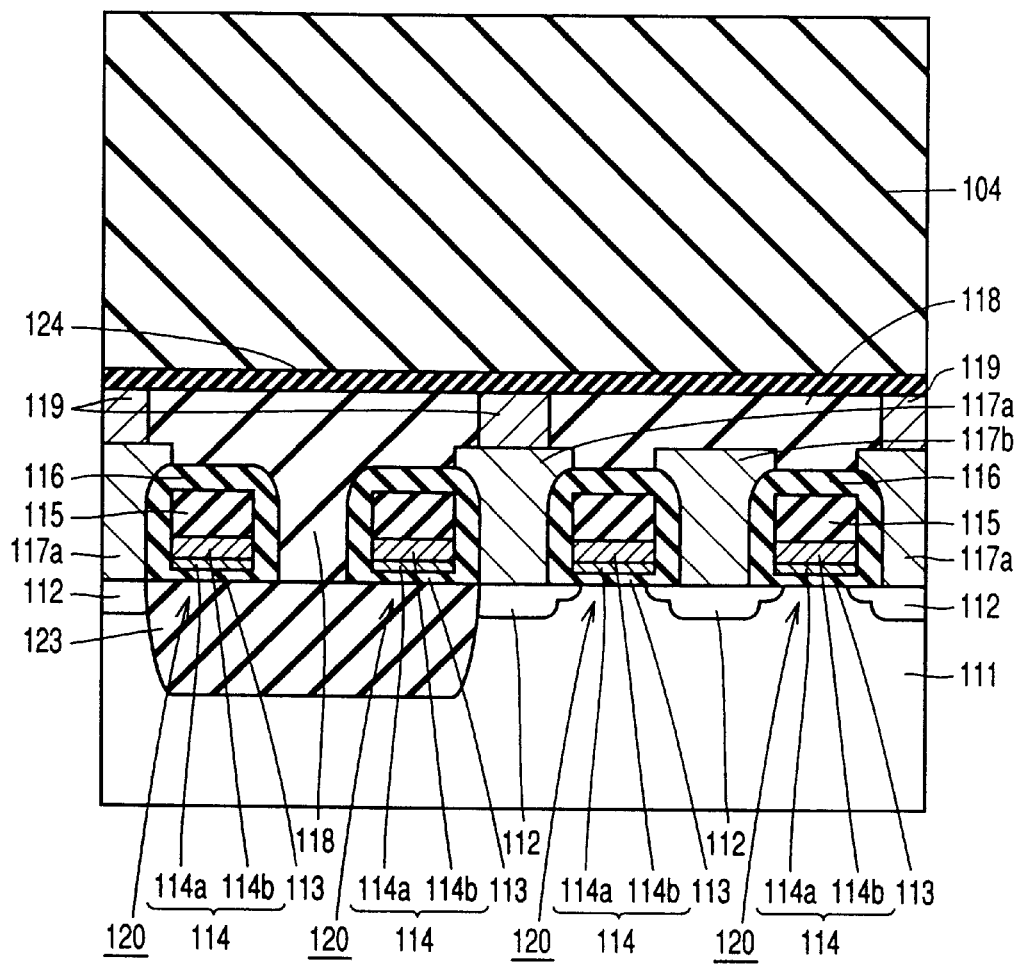
FIGS. 24 to 28 are schematic sectional views showing a method of manufacturing the conventional semiconductor device having capacitors in step order.
Figure 25:
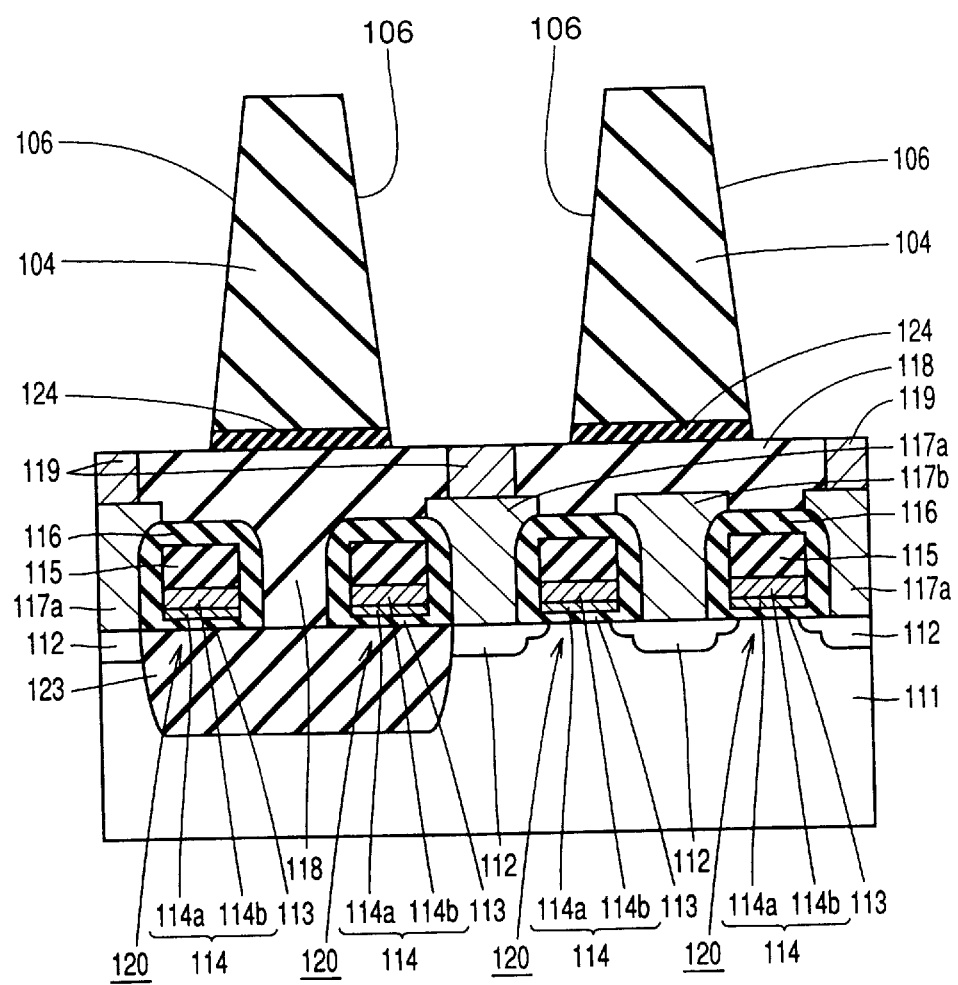
Figure 26:
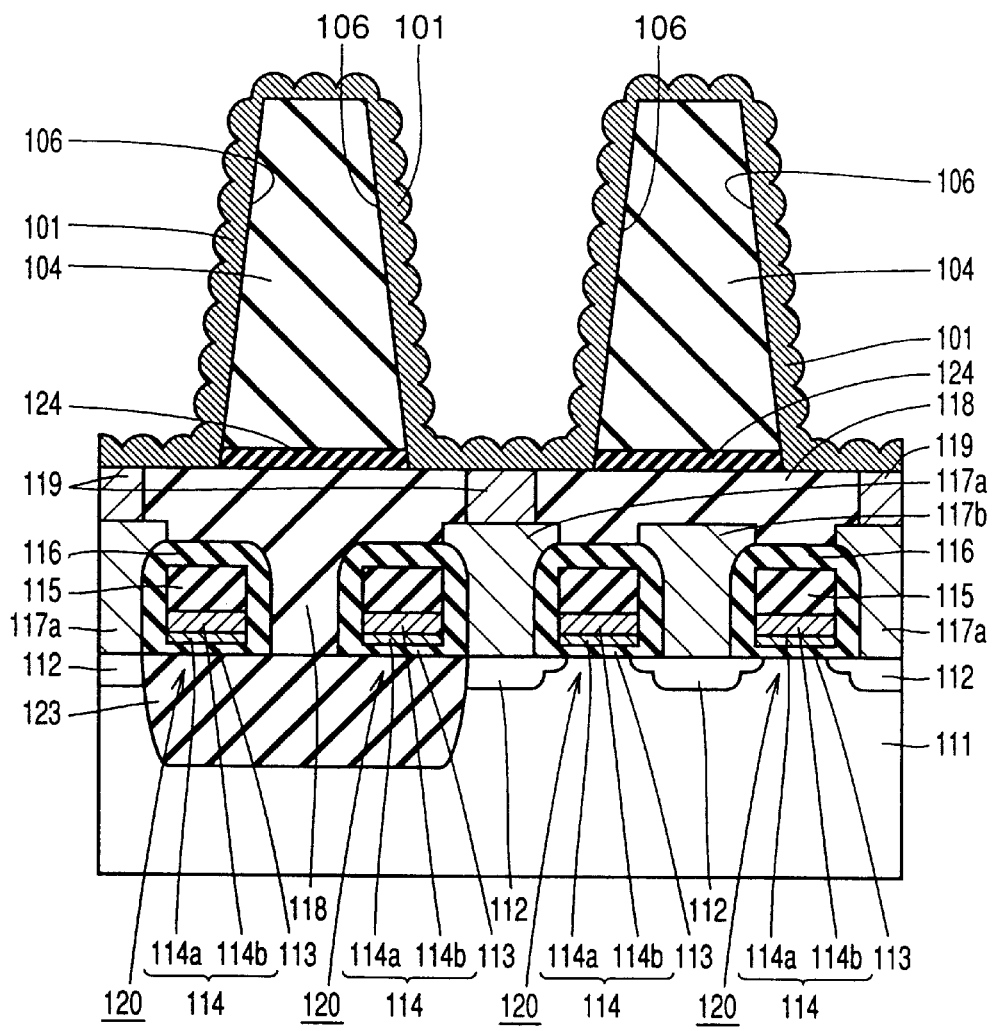
Figure 27:
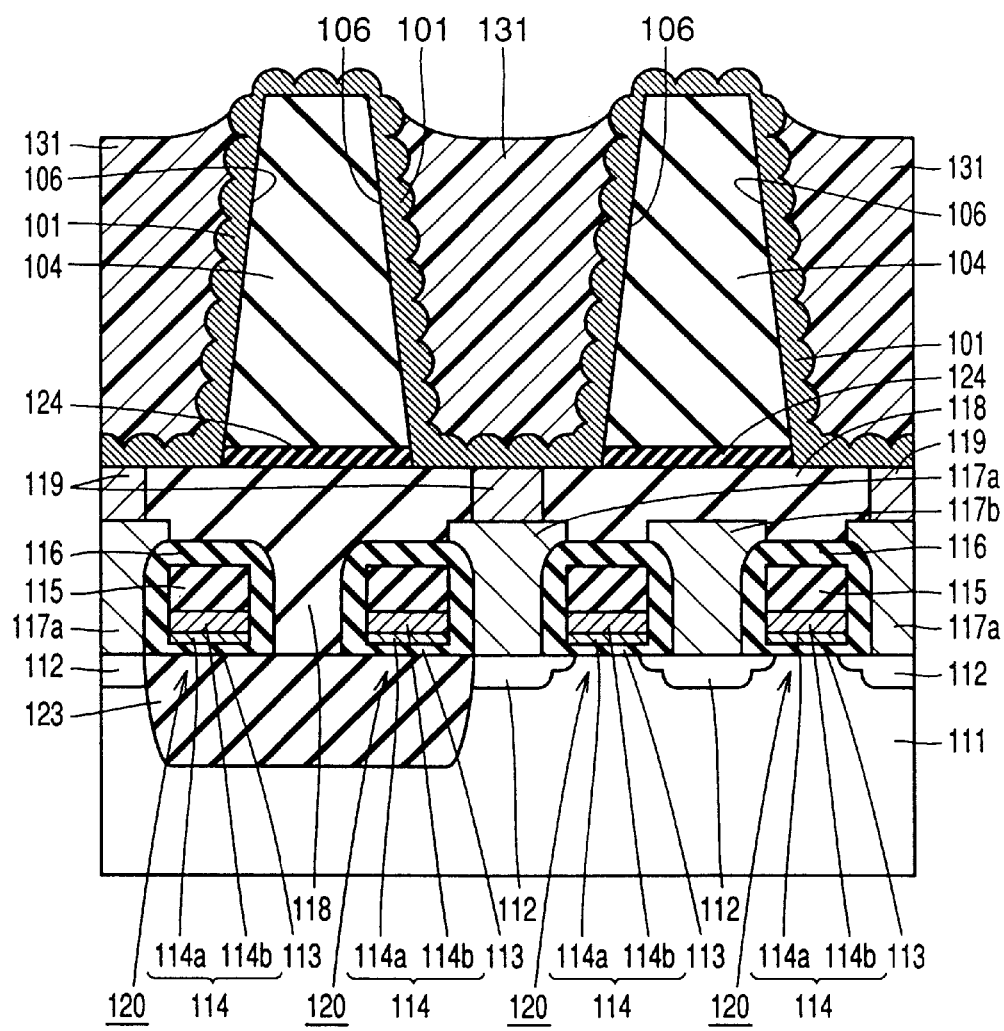
Figure 28:
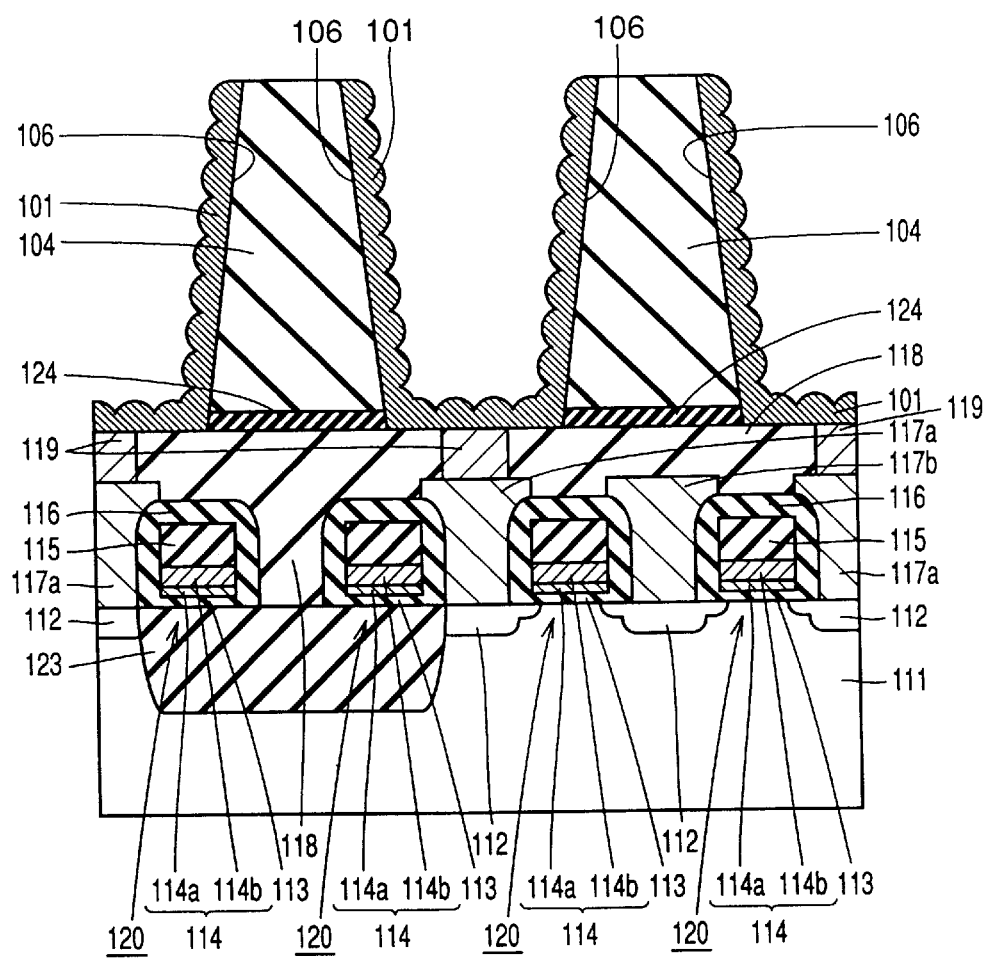
Figure 29:
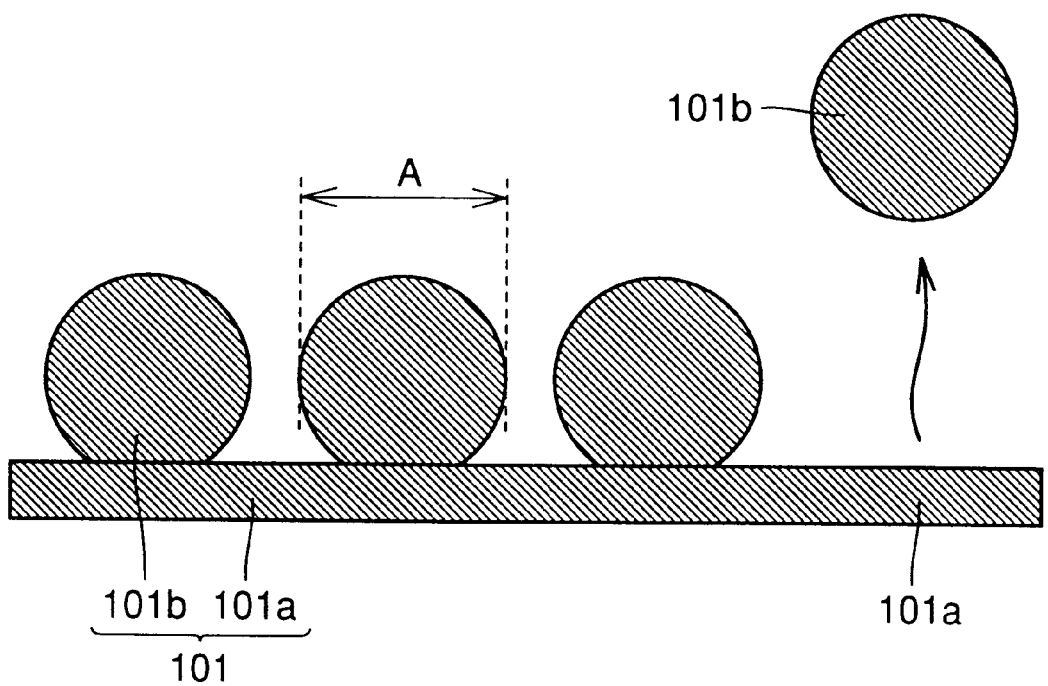
FIG. 29 is a diagram for illustrating separation of a storage node in the conventional semiconductor device having a capacitor.
Figure 30:
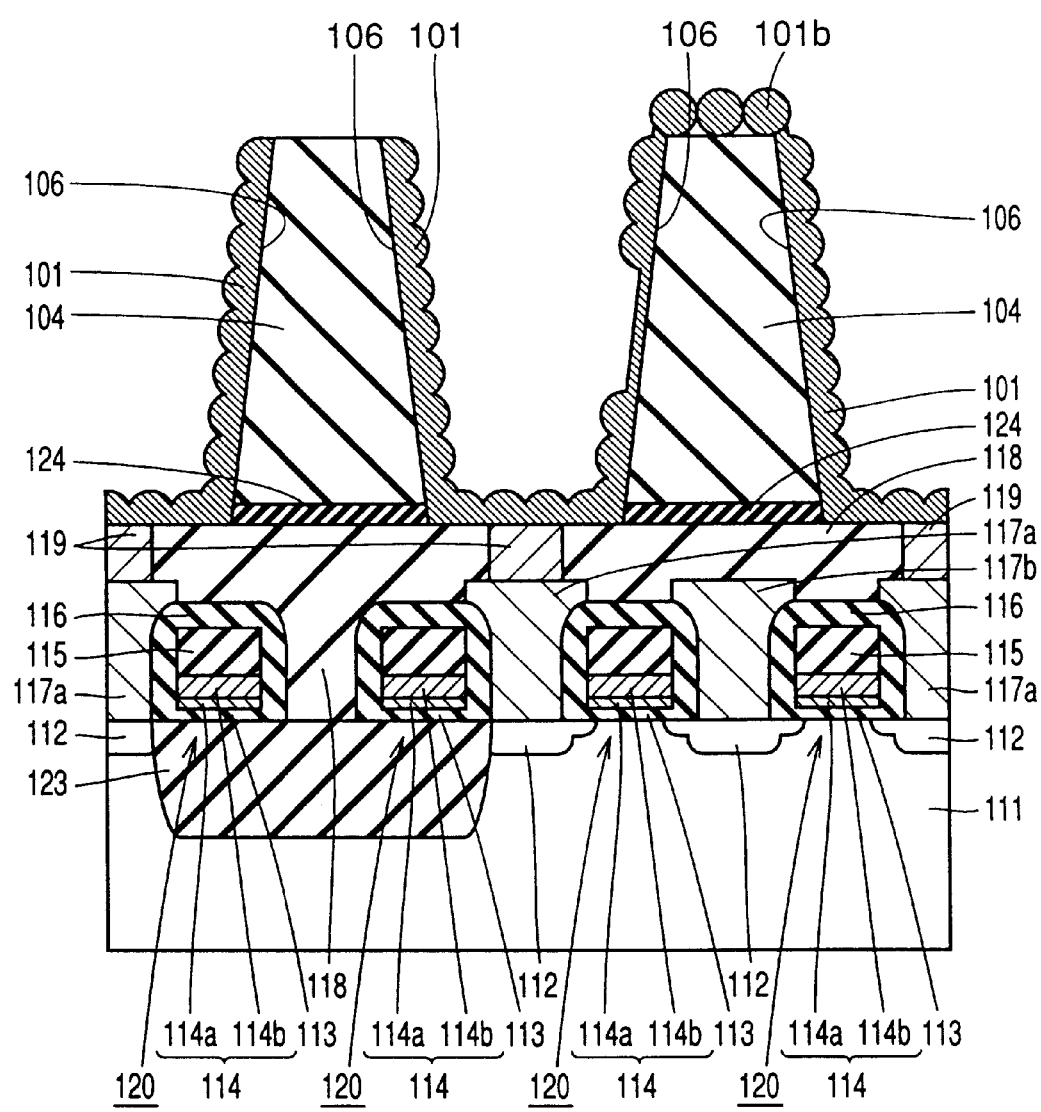
FIG. 30 is a schematic sectional view for illustrating occurrence of shorting resulting from separation of the storage node.
Figure 31:
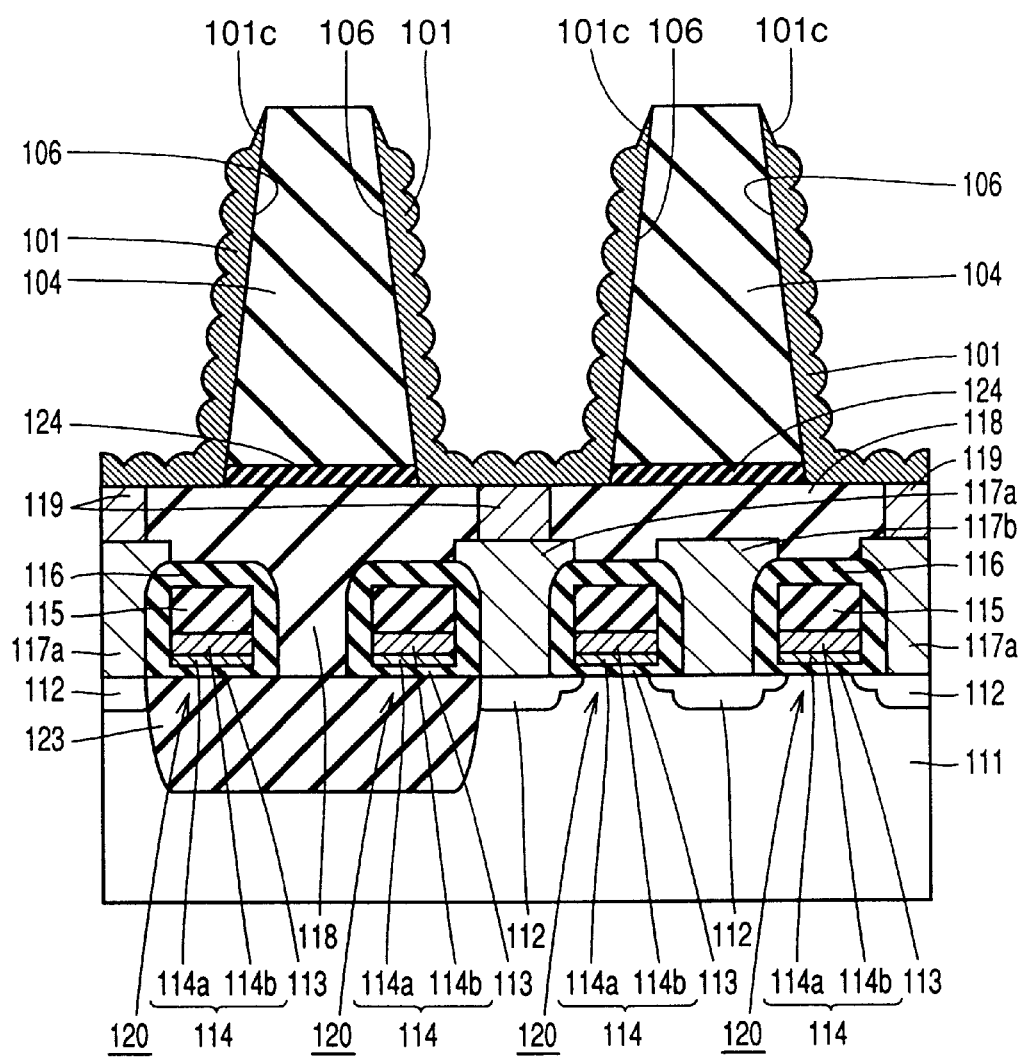
FIG. 31 is a schematic sectional view showing formation of a sharp forward end on the upper end of the storage node in the conventional semiconductor device having capacitors.

Referring to FIG. 22, a natural oxide film is removed by this etching while the etching solution infiltrates from the holes of the storage node 1 to remove the side wall of the BPTEOS film 4 by a thickness of 100 to 200 nm. Thus, a clearance is defined between the storage node 1 and the side wall of the BPTEOS film 4. The upper end of the storage node 1 is in close contact with the side wall of the silicon nitride film 21, and hence the cylindrical portion of the storage node 1 is prevented from falling.

Thereafter the capacitor dielectric layer 2 is formed as shown in FIGS. 14 and 15. The capacitor dielectric layer 2 is so formed that the relation between the thickness C thereof and the space B between the crystal grains 1b on the surface of the storage node 1 satisfy B>2×C. The cell plate 3 consisting of doped polysilicon is formed to be opposed to both the inner and outer peripheral surfaces of the cylindrical portion of the storage node 1 through the capacitor dielectric layer 2, for completing the semiconductor device having capacitors 10 according to this embodiment.

According to this embodiment, the cell plate 3 is opposed to both the inner and outer peripheral surfaces of the cylindrical portion of the storage node 1, as shown in FIGS. 14 and 15. Therefore, a large capacitance can be ensured and a semiconductor device having high reliability can be obtained.

The material of the silicon nitride film 21 formed on the BPTEOS film 4 is hardly etched by aqueous hydrofluoric acid. Also when etching the side walls of the BPTEOS film 4 as shown in FIG. 22, the side walls of the silicon nitride film 21 remain in close contact with the upper end of the storage node 1. Thus, the cylindrical portion of the storage node 1 can be prevented from falling. Further, the upper surface of the silicon nitride film 21 can be prevented from being remarkably etched by the etching with aqueous hydrofluoric acid.

While the first silicon oxide film 4 prepared from an organic raw material to contain phosphorus and boron is illustrated as a BPTEOS film in each of the aforementioned first to fifth embodiments, the film 4 may alternatively be made of another material. While the second silicon oxide film 5 prepared from an organic raw material to substantially contain no impurities is illustrated as a TEOS film, the film 5 may alternatively be made of another material.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a capacitor, comprising:
    a semiconductor substrate having a conductive region at the main surface;
    a silicon nitride film formed on the main surface of said semiconductor substrate;
    a first silicon oxide film formed on said silicon nitride film and containing an impurity; and
    a second silicon oxide film formed on said first silicon oxide film and substantially containing no impurities, wherein
        an opening is formed through said silicon nitride film and said first and second silicon oxide films,
        said semiconductor device further comprises a lower electrode of a capacitor electrically connected with said conductive region and formed along the side wall and the bottom wall of said opening.

2. The semiconductor device having a capacitor according to claim 1, wherein the upper end of said lower electrode is located downward beyond the upper surface of said second silicon oxide film.

3. The semiconductor device having a capacitor according to claim 1, wherein said lower electrode consists of a material containing silicon, and
    an impurity supplying conductivity is introduced into said lower electrode in impurity concentration of the solubility limit of silicon.

4. The semiconductor device having a capacitor according to claim 1, wherein said first silicon oxide film is prepared from an organic raw material to contain phosphorus and boron, and
    said second silicon oxide film is prepared from an organic raw material to substantially contain no impurities.

* * * * *